United States Patent
Zhu

(10) Patent No.: US 12,068,413 B2
(45) Date of Patent: Aug. 20, 2024

(54) SEMICONDUCTOR DEVICE AND MANUFACTURING METHOD THEREOF AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 18/315,836

(22) Filed: May 11, 2023

(65) Prior Publication Data

US 2023/0282743 A1 Sep. 7, 2023

Related U.S. Application Data

(62) Division of application No. 17/281,162, filed as application No. PCT/CN2018/113045 on Oct. 31, 2018, now Pat. No. 11,688,806.

(30) Foreign Application Priority Data

Oct. 8, 2018 (CN) .......................... 201811171546.8

(51) Int. Cl.
*H01L 29/78* (2006.01)
*H01L 21/8234* (2006.01)
(Continued)

(52) U.S. Cl.
CPC .. *H01L 29/7827* (2013.01); *H01L 21/823412* (2013.01); *H01L 21/823425* (2013.01);
(Continued)

(58) Field of Classification Search
CPC ....... H01L 29/66666; H01L 21/823885; H01L 21/823412; H01L 21/823456; H01L 21/823425
See application file for complete search history.

(56) References Cited

U.S. PATENT DOCUMENTS 9,741,731 B2 8/2017 Lai et al.
10,629,498 B2 4/2020 Zhu et al.
(Continued)

FOREIGN PATENT DOCUMENTS

CN 106252352 A 12/2016
CN 106298679 A 1/2017
(Continued)

OTHER PUBLICATIONS

International Search Report for PCT/CN2018/113045, mailed Jul. 9, 2019 (2 pgs.).
(Continued)

*Primary Examiner* — John A Bodnar
(74) *Attorney, Agent, or Firm* — Christensen, Fonder, Dardi & Herbert PLLC

(57) ABSTRACT

A compact vertical semiconductor device and a manufacturing method thereof, and an electronic apparatus including the semiconductor device are provided. According to the embodiments, the vertical semiconductor device may include: a plurality of vertical unit devices stacked on each other, in which the unit devices include respective gate stacks extending in a lateral direction, and each of the gate stacks includes a main body, an end portion, and a connection portion located between the main body and the end portion, and in a top view, a periphery of the connection portion is recessed relative to peripheries of the main body and the end portion; and a contact portion located on the end portion of each of the gate stacks, in which the contact portion is in contact with the end portion.

9 Claims, 27 Drawing Sheets

(51) Int. Cl.
*H01L 27/088* (2006.01)
*H01L 29/423* (2006.01)
*H01L 29/45* (2006.01)

(52) U.S. Cl.
CPC ............ *H01L 21/823468* (2013.01); *H01L 21/823487* (2013.01); *H01L 27/088* (2013.01); *H01L 29/42392* (2013.01); *H01L 29/458* (2013.01)

(56) References Cited

U.S. PATENT DOCUMENTS

| | | |
|---|---|---|
| 2017/0330628 A1 | 11/2017 | Oh et al. |
| 2017/0358594 A1 | 12/2017 | Lu et al. |
| 2018/0096896 A1 | 4/2018 | Zhu |
| 2020/0035691 A1* | 1/2020 | Reznicek .............. H01L 29/105 |
| 2020/0035696 A1 | 1/2020 | Zhu |

FOREIGN PATENT DOCUMENTS

| | | |
|---|---|---|
| CN | 107358973 A | 11/2017 |
| CN | 107887385 A | 4/2018 |
| CN | 107887443 A | 4/2018 |

OTHER PUBLICATIONS

Chinese Patent Office Action for CN 201811171546.8, mailed Mar. 20, 2020 (6 pgs.).
Chinese Patent Office Action for CN 201811171546.8, mailed Oct. 13, 2020 (5 pgs.).
Chinese Patent Office Action for CN 201811171546.8, mailed Feb. 22, 2021 (5 pgs.).

* cited by examiner

SEMICONDUCTOR DEVICE AND MANUFACTURING METHOD THEREOF AND ELECTRONIC APPARATUS INCLUDING THE SAME

CROSS-REFERENCE TO RELATED APPLICATION(S)

This application is Divisional Application of U.S. patent application Ser. No. 17/281,162, filed on Mar. 29, 2021, which is a Section 371 National Stage Application of International Application No. PCT/CN2018/113045, filed on Oct. 31, 2018, which claims priority to Chinese Patent Application No. 201811171546.8 entitled "SEMICONDUCTOR DEVICE AND MANUFACTURING METHOD THEREOF AND ELECTRONIC APPARATUS INCLUDING THE SAME" filed on Oct. 8, 2018, which are incorporated herein by reference in their entireties.

TECHNICAL FIELD

The present disclosure relates to a field of semiconductor, an in particular to a compact vertical semiconductor device, a method of manufacturing the vertical semiconductor device, and an electronic apparatus including the semiconductor device.

BACKGROUND

A vertical device may have good characteristics about device, such as good electrostatic characteristics, good short-channel effect control, small sub-threshold swing and resulting low power consumption. This makes it possible to further shrink the device to increase an integration density. In some applications, it is necessary to connect several transistors in series to, for example, form a NAND gate. These transistors may be stacked vertically to save area. However, there are difficulties in forming interconnections between the transistors.

SUMMARY

In view of this, the purpose of the present disclosure is at least partly to provide a compact vertical semiconductor device and a manufacturing method thereof, and electronic apparatus including such a semiconductor device.

According to an aspect of the present disclosure, a vertical semiconductor device is provided, including: a plurality of vertical unit devices stacked on each other, wherein the unit devices comprise respective gate stacks extending in a lateral direction, and each of the gate stacks comprises a main body, an end portion, and a connection portion located between the main body and the end portion, and wherein in a top view, a periphery of the connection portion is recessed relative to peripheries of the main body and the end portion; and a contact portion located on the end portion of each of the gate stacks, wherein the contact portion is in contact with the end portion.

According to another aspect of the present disclosure, a method of manufacturing a vertical semiconductor device is provided, including: providing a stack of source/drain layers and channel layers stacked alternately on a substrate; providing a hard mask layer on the stack, wherein the hard mask layer is patterned to have a device defining portion, a contact defining portion, and a connection portion located between the device defining portion and the contact defining portion, and in a top view, the connection portion is recessed relative to the device defining portion and the contact defining portion; patterning the stack by using the hard mask layer as a mask; etching the channel layers selectively to remain the channel layers under the device defining portion of the hard mask layer; filling a space with a first dielectric layer, wherein the space is left under the hard mask layer due to the selective etching of the channel layers; etching the source/drain layers selectively to remain the source/drain layers under the device defining portion of the hard mask layer; filling a space with a second dielectric layer, wherein the space is left under the hard mask layer due to the selective etching of the source/drain layers; performing a replacement gate process to replace the first dielectric layer with gate stacks, and wherein each of the gate stacks comprises a main body under the device defining portion of the hard mask layer, an end portion under the contact defining portion of the hard mask layer, and a connection portion under the connection portion of the hard mask layer; patterning at least a part of the end portion of each of the gate stacks so that an end portion of an upper gate stack exposes an end portion of a lower gate stack; and forming a contact portion on the end portion of each of the gate stacks, wherein the contact portion is in contact with the end portion.

According to another aspect of the present disclosure, an electronic apparatus is provided, including the above-mentioned vertical semiconductor device.

According to the embodiments of the present disclosure, the gate stack may extend laterally, and in particular, the gate stack may extend beyond the active region, this facilitates manufacturing the contact portion in contact to the gate stack. The connection portion of the gate stack is recessed relative to the main body and the end portion. In one aspect, the structure may define feature dimensions of the device (corresponding to the main body), in another aspect, the structure is convenient for contact with the contact portion. The unit devices are stacked vertically on each other, thereby the source/drain regions of adjacent unit devices may physically connected or share with each other, so that it is easy to form a series connection.

BRIEF DESCRIPTION OF THE DRAWINGS

Through the following description of the embodiments of the present disclosure with reference to the accompanying drawings, the above and other objectives, features, and advantages of the present disclosure will be more apparent, in the accompanying drawings:

FIGS. 1 to 25 show schematic views of a process of manufacturing a semiconductor device according to the embodiments of the present disclosure, in which, FIG. 1 and FIG. 2 are sectional views; FIGS. 3(a), 6, 7, 8(a), 11(a), 12(a), 13(a), and 15(a) are top views; FIGS. 9(a), 10(a), 11(b), 13(b), 14(a), 15(b), 16(a), 17(a), 18(a), 19(a), 20, 21, 22, 23, 24, and 25 are sectional views along line AA' in FIG. 3(a); FIGS. 3(b), 4, 5, 8(b), 9(b), 10(b), 11(c), 13(c), 14(b), 18(b), and 19(b) are sectional views along line BB' in FIG. 3(a)

FIGS. 29(a) to 30(c) show schematic views of some stages in a process of manufacturing a semiconductor device according to the embodiments of the present disclosure, in which, FIGS. 29(a) and 30(a) are sectional views along line AA' in FIG. 3(a); FIGS. 29(c) and 30(c) are sectional views along line EE' in FIG. 15(a);

Figure 1:
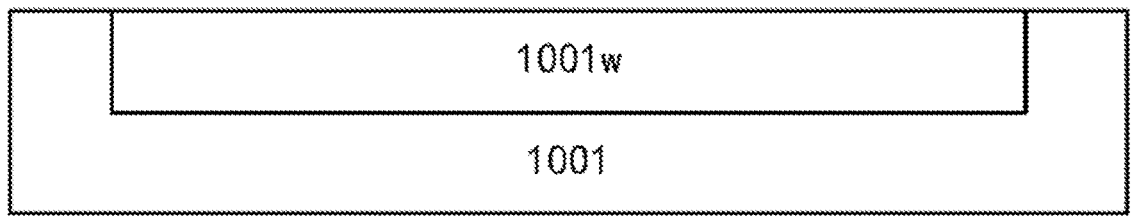

Throughout the accompanying drawings, same or similar reference signs indicate same or similar components.

DETAILED DESCRIPTION OF EMBODIMENTS

Hereinafter, the embodiments of the present disclosure will be described with reference to the accompanying drawings. However, it should be understood that these descriptions are only exemplary and are not intended to limit the scope of the present disclosure. In addition, in the following description, descriptions of well-known structures and technologies are omitted, so as to avoid unnecessarily obscuring the concept of the present disclosure.

Various structural schematic diagrams according to the embodiments of the present disclosure are show in the accompanying drawings. These drawings are not drawn to scale, some details are enlarged and some details may be omitted for clarity of presentation. Shapes of the various areas and layers shown in the drawings and relative size and positional relationships between them are only exemplary. In practice, there may be deviations due to manufacturing tolerances or technical limitations, and those skilled in the art may additionally design areas/layers with different shapes, sizes, and relative positions according to actual needs.

In the context of the present disclosure, when a layer or an element is referred to as being "on" another layer or element, the layer or element may be directly on the another layer or element, or there may be an intermediate layer or element between them. In addition, if a layer or an element is located "on" another layer or element in one orientation, the layer or element may be located "under" another layer or element when the orientation is reversed.

A vertical semiconductor device according to the embodiments of the present disclosure may include a plurality of vertical unit devices stacked on each other on a substrate. The so-called "vertical" device means that an active region of the device extends in a vertical direction (for example, in a direction substantially perpendicular to a surface of the substrate). In this vertical device, a gate stack may be formed at least partially around a periphery of the active region (more specifically, a channel region therein), and may extend laterally (for example, in a direction substantially parallel to the surface of the substrate). According to the embodiments of the present disclosure, a corresponding gate stack of each unit device includes a main body, an end portion, and a connection portion located between the main body and the end portion. In a top view, a periphery of the connection portion is recessed relative to peripheries of the main body and the end portion. As will be described in detail below, in one aspect, this type of gate stack is beneficial for defining a feature dimension of the unit device; and in another aspect, beneficial for contacting with a contact portion. The contact portion in contact with each gate stack may be formed on the end portion of the corresponding gate stack.

The gate stacks of the unit devices may extend laterally along a substantially same direction (for example, they are manufactured according to a same mask). In this case, in order to avoid mutual interference between the contact portions of the gate stacks, an end portion of a gate stack in a lower unit device may extend beyond an end portion of a gate stack in an upper unit device. For example, the main bodies of the gate stacks may have a substantially same size, and the connection portions of the gate stacks may have a substantially same size, and the end portion of the gate stack in the upper unit device may be patterned to expose at least a part of the end portion of the gate stack in the lower unit device. For example, in a top view, the main bodies of the gate stacks are substantially overlapped with each other, the connection portions of the gate stacks are substantially overlapped with each other, and the end portion of the gate stack in the upper unit device occupies a part of the end portion of the gate stack in the lower unit device.

According to the embodiments of the present disclosure, a vertical active region of each unit device may include a first source/drain layer, a channel layer, and a second source/drain layer stacked in sequence. Source/drain regions of the device may be formed in the first source/drain layer and the second source/drain layer, and a channel region of the device may be formed in the channel layer. A conductive channel may be formed between the source/drain regions at both ends of the channel region through the channel region.

According to the embodiments of the present disclosure, the unit device may be a conventional field effect transistor (FET). In the case of FET, the first source/drain layer and the second source/drain layer (or the source/drain regions on both sides of the channel layer) may be doped into a same conductivity type (for example, an n-type or a p-type). The conductive channel may be formed between the source/drain regions at both ends of the channel region through the channel region. Alternatively, the unit device may be a tunneling FET. In the case of the tunneling FET, the first source/drain layer and the second source/drain layer (or the source/drain regions on both sides of the channel layer) may be doped into different or opposite conductivity types (for example, an n-type and a p-type, respectively). In this case, charged particles such as electrons may tunnel from the source region through the channel region and into the drain region, and thus a conduction path is formed between the source region and the drain region. Although conduction mechanisms in conventional FETs and tunneling FETs are not the same, they both exhibit electrical properties that may control the conduction between the source region and the drain region through the gate. Therefore, for conventional FETs and tunneling FETs, the terms "source/drain layer (source/drain region)" and "channel layer (channel region)" are unified to describe, although there is no "channel" of ordinary meaning in tunneling FETs.

The gate stack may be formed around at least a part of the periphery of the channel layer. According to the embodiments of the present disclosure, the gate stack may be self-aligned to the channel layer. For example, the gate stack may be substantially coplanar with the channel layer. In particular, a space occupied by the gate stack may be defined by an interface between the channel layer and the first source/drain layer and an interface between the channel layer and the second source/drain layer. In this case, an upper surface of the gate stack may be substantially coplanar with an upper surface of the channel layer, and a lower surface of the gate stack may be substantially coplanar with the lower surface of the channel layer.

The channel layer may include a single crystal semiconductor material to improve performances of the device. Of course, the source/drain layer may also be made of a single crystal semiconductor material. In this case, the single crystal semiconductor material of the channel layer and the single crystal semiconductor material of the source/drain layer may be eutectic.

According to the embodiments of the present disclosure, the channel layer may have an etching selectivity with respect to that of the source/drain layer, for example, the channel layer may include a semiconductor material different from that of the source/drain layer. In this way, it is advantageous to process, such as selectively etching, the channel layer and the source/drain layer, respectively. In addition, the first source/drain layer and the second source/drain layer may include a same semiconductor material.

According to the embodiments of the present disclosure, the source/drain layer between two adjacent unit devices may be shared by the two adjacent unit devices. Therefore, adjacent unit devices may be connected in series without forming an additional interconnection structure between the adjacent unit devices. In addition, in the case of tunneling FET, the source/drain layer between adjacent unit devices may have opposite doping types, thereby forming a pn junction.

According to the embodiments of the present disclosure, it is also possible to provide a leakage limiting layer or an on-state current enhancement layer between the first source/drain layer and the channel layer and/or between the channel layer and the second source/drain layer (in the case of tunneling FET, especially between the two layers constituting the tunneling junction). A band gap of the leakage limiting layer may be greater than a band gap of at least one of an adjacent layer above the leakage limiting layer and an adjacent layer under the leakage limiting layer. A band gap of the on-state current enhancement layer may be smaller than a band gap of at least one of an adjacent layer above the on-state current enhancement layer and an adjacent layer under the on-state current enhancement layer. Due to differences in the band gaps, the leakage may be suppressed or the on-state current may be enhanced.

According to the embodiments of the present disclosure, a contact portion in contact with a second source/drain layer in the uppermost unit device may be provided on the top of the active region, so as to at least partially overlap the main body of the active region to save an occupied area. In addition, a first source/drain layer in the lowermost unit device may extend beyond the main body of the active region so as to manufacture a contact portion in contact with the first source/drain layer on the first source/drain layer. In addition, the source/drain layers between the unit devices are connected to each other (such that the unit devices are connected in series) due to, for example, sharing with each other as described above and/or due to silicide formed as described below, without any additional interconnection structure.

Such semiconductor device may be manufactured as follows, for example.

According to the embodiments of the present disclosure, a stack in which the source/drain layers and the channel layers stacked alternately may be provided on the substrate. For example, the layers may be formed by epitaxial growth. Due to separate epitaxial growth, at least a pair of adjacent layers may have a clear crystal interface. In addition, each layer may be doped separately, and at least a pair of adjacent layers may have a doping concentration interface. In addition, as described above, the source/drain layer between the channel layers may be integrally doped into a same type, so that the source/drain layer may be shared by the upper and lower channel layers; alternatively, the source/drain layer may include sub-layers, for example, two sub-layers, and at least some of the sub-layers may be doped into different types, respectively. For a same channel layer, the upper and lower source/drain layers or sub-layers may be doped into a same conductivity type (a conventional FET) or opposite conductivity types (a tunneling FET).

For the above-mentioned stack, the active region may be defined therein. For example, the layers in the stack may be selectively etched into desired shapes in sequence. Generally, the active region may be columnar.

According to the embodiments of the present disclosure, to facilitate patterning, a hard mask layer may be provided on the top of the stack. The hard mask layer may be patterned to have a device defining portion for defining the active region, a contact defining portion for defining a position of a gate contact portion, and a connection portion for connecting the device defining portion and the contact defining portion. In a top view, in one aspect, the connection portion is recessed relative to the device limiting portion, so that the feature dimension of the device may be substantially defined by the device limiting portion; in another aspect, the connection portion is recessed relative to the contact limiting portion, so that the contact limiting portion may define a greater area to facilitate manufacturing the contact portion. According to the embodiments of the present disclosure, such hard mask layer may be patterned by, for example, a pattern transfer technology.

The hard mask layer may be used as a mask to pattern the stack. Thus, the pattern of the hard mask layer is transferred to the stack. In order to facilitate connecting the source/drain region formed in the lowermost source/drain layer in a subsequent process, the lowermost source/drain layer may have a portion extending beyond a periphery of an active region above the lowermost source/drain layer, for example, beyond a boundary of the hard mask layer. For example, when patterning the stack, the patterning may be stopped on or in the lowermost source/drain layer. Then, in a case of shielding a part of the source/drain layer, the hard mask layer may be used as a mask to continue to pattern the source/drain layer. In this way, except for the shielded part exceeding the boundary of the hard mask layer, the pattern of the lowermost source/drain layer is substantially the same as the pattern of the hard mask layer.

The channel layer may be further selectively etched, so that the channel layer is left under the device defining portion of the hard mask layer to obtain the channel layer for the final device. For example, the channel layer is selectively etched so that its periphery is recessed inward with respect to the periphery of the hard mask layer. An amount of the etching may be controlled so that a part of the channel layer corresponding to the connection portion of the hard mask layer is etched (since the part of the channel layer is relatively thin), and the channel layer is divided into a first part corresponding to the device defining portion of the hard mask layer and a second part corresponding to the contact defining portion of the hard mask layer. Then, while shielding the first part of the channel layer, the second part of the channel layer is removed.

Due to the relative recession of the channel layer, a space is left between the source/drain layers. The space may be used to form a gate stack, and the gate stack formed as such may be self-aligned to the channel layer. In order to avoid an influence of subsequent processing on the gate stack, a replacement gate technology is used here. That is, the other layer is used to occupy the space (that is, a space for the gate stack is formed later) between the source/drain layers firstly, and then the other layer is replaced with a real gate stack when some processes are completed. For example, a first dielectric layer may be used to fill the space left under the hard mask layer due to the selective etching of the channel layers.

The source/drain layer may be processed similarly to the channel layer, the source/drain layer is left under the device defining portion of the hard mask layer to obtain the source/drain layer for the final device. In order to facilitate manufacturing the contact portion, a part of the lowermost source/drain layer may extend from under the device defining portion to the outside of the hard mask layer. Thus, the active region (the channel layer, the source/drain layer) of the device is substantially defined by the device defining portion of the hard mask layer. The second dielectric layer may be used to fill a space left under the hard mask layer due to the selective etching of the source/drain layers. In this way, the source/drain layers may be effectively electrically isolated from other layers unexpected to be electrically connected. This electrical isolation may be self-aligned to the source/drain layer.

After the active region is defined, the replacement gate process may be performed to replace the first dielectric layer with the gate stacks. Due to the existence of the hard mask layer, each of the gate stacks may include a main body under the device defining portion of the hard mask layer, an end portion under the contact defining portion of the hard mask layer, and a connection portion under the connection portion of the hard mask layer. At least a part of the end portion of each of the gate stacks may be patterned so that an end portion of an upper gate stack may expose an end portion of a lower gate stack, and then the contact portion may be formed on the end portion of each gate stack and is in contact with the end portion.

The present disclosure may be presented in a plurality of forms, some examples of which are described below.

FIGS. 1 to 25 show schematic views of a process of manufacturing a semiconductor device according to the embodiments of the present disclosure.

As shown in FIG. 1, a substrate 1001 is provided. The substrate 1001 may be a substrate of various forms, including but not limited to a bulk semiconductor material substrate, such as bulk Si substrate, a semiconductor-on-insulator (SOI) substrate, a compound semiconductor substrate, such as SiGe substrate, etc. In the following, for the convenience of description, the bulk Si substrate is taken as an example for description.

In the substrate 1001, a well region 1001w may be formed. If a p-type device is to be formed, the well region 1001w may be an n-type well; and if an n-type device is to be formed, the well region 1001w may be a p-type well. The well region 1001w may be formed by, for example, injecting corresponding conductivity type dopants (p-type dopants such as B or In, or n-type dopants such as As or P) into the substrate 1001 and then performing thermal annealing. A doping concentration may be about $1E17-2E19$ cm$^{-3}$. There are many ways to provide such well regions in the art, which will not be repeated here.

Figure 2:
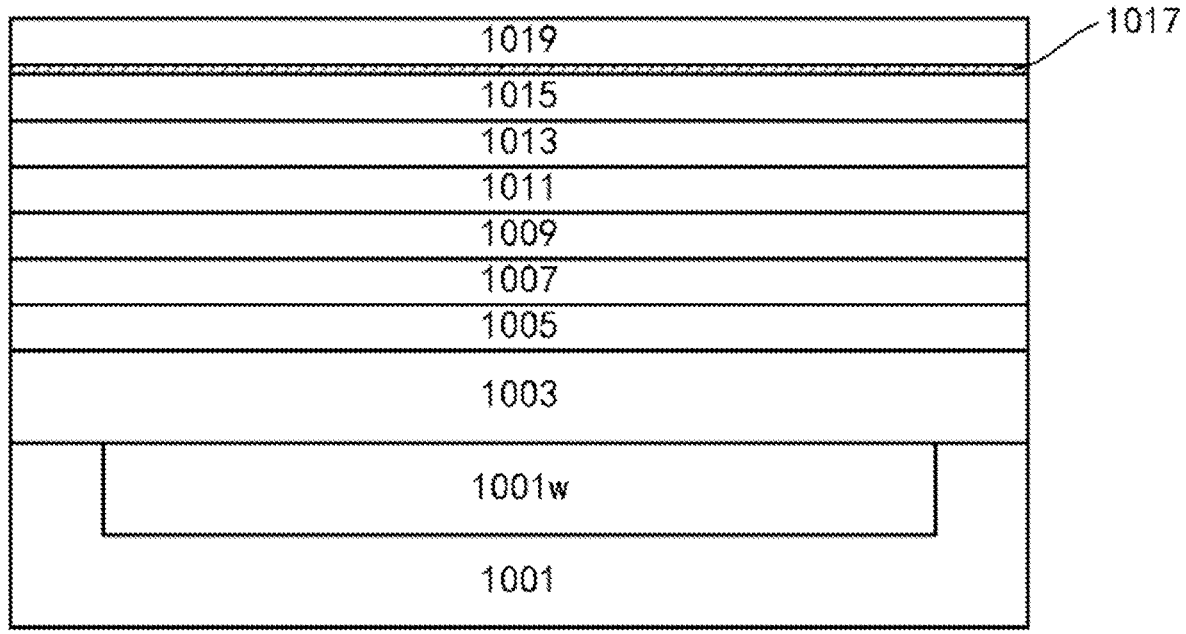

As shown in FIG. 2, a stack of source/drain layers 1003, 1007, 1011, 1015 and channel layers 1005, 1009, 1013 stacked alternately may be formed on the substrate 1001 in sequence by, for example, epitaxial growth. All of the layers are semiconductor material layers. For example, the source/drain layers 1003, 1007, 1011, and 1015 may include semiconductor materials such as Si, with a thickness of 10 to 50 nm. However, a thickness of the lowermost source/drain layer 1003 may be slightly thicker, being about 20 to 100 nm. The channel layers 1005, 1009, and 1013 may include semiconductor materials different from those of the source/drain layers 1003, 1007, 1011, 1015, such as SiGe (an atomic percentage of Ge may be about 10 to 40%), with a thickness of 10 to 100 nm. Of course, the present disclosure is not limited to this, as long as the channel layers have etching selectivity relative to the source/drain layers.

When the source/drain layers and the channel layers are grown, they may be doped in-situ to dope them to desired conductivity types and doping concentrations. For example, in a case of forming an n-type FET, the source/drain layers 1003, 1007, 1011, and 1015 may be doped into n-type with n-type impurities such as As or P, and the doping concentration may be about $1E18$ to $1E21$ cm$^{-3}$; and in a case of forming a p-type FET, the source/drain layers 1003, 1007, 1011, and 1015 may be doped into p-type with p-type impurities such as B or In, and the doping concentration may be about $1E18$ to $2E20$ cm$^{-3}$. The channel layers 1005, 1009, and 1013 may be unintentionally doped, or lightly doped to adjust a threshold voltage ($V_t$) of the device. In a case of forming a tunneling FET, a source/drain layer on a channel layer and a source/drain layer under the same channel layer may be doped into opposite conductivity types, which is described in further detail below. Of course, the doping manner is not limited to in-situ doping, other manners such as ion implantation and the like may also be used.

In this example, three channel layers 1005, 1009, and 1013 are formed, and accordingly, three unit devices stacked on each other may be formed subsequently. However, the present disclosure is not limited to this, more (such as four or more) or less (such as one or two) unit devices may be formed.

A hard mask layer 1019 may be formed on the stack by, for example, deposition. For example, the hard mask layer 1019 may include nitride (for example, silicon nitride) or other low-k materials (for example, silicon carbide-based materials), with a thickness of about 10 to 100 nm. In addition, before forming the hard mask layer 1019, a thin layer 1017 for protection and etching stop (hereinafter referred to as an etching stop layer) may be formed by, for example, deposition or thermal oxidation. For example, the etching stop layer 1017 may include oxide (for example, silicon oxide), with a thickness of about 2 to 5 nm.

Next, the hard mask layer 1019 may be patterned into a desired shape including, such as shapes of the device defining portion, the contact defining portion, and the connection portion described above. As described above, this may be formed by a pattern transfer technology.

Figure 3A:
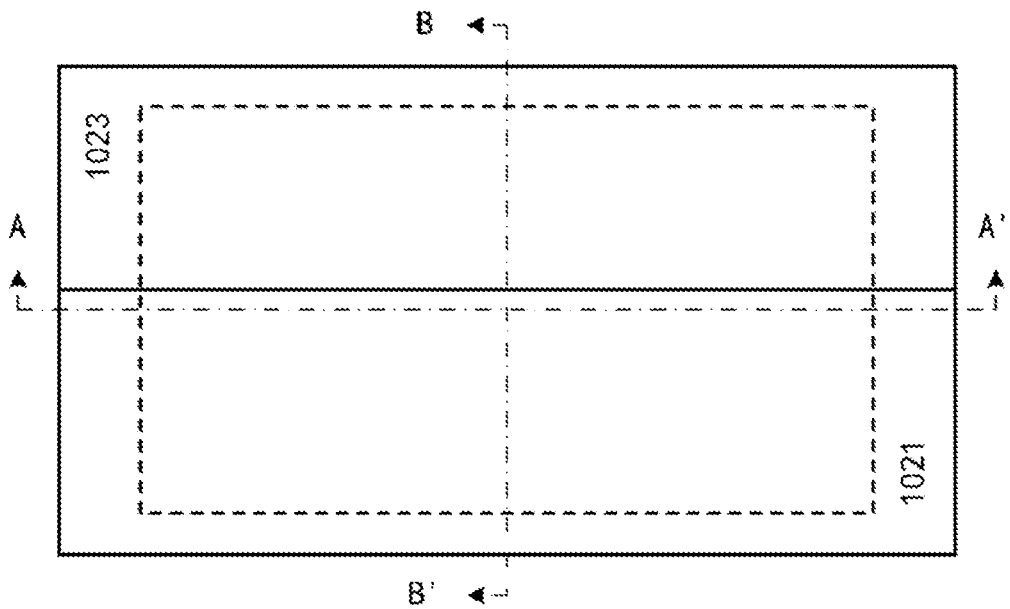
Figure 3B:
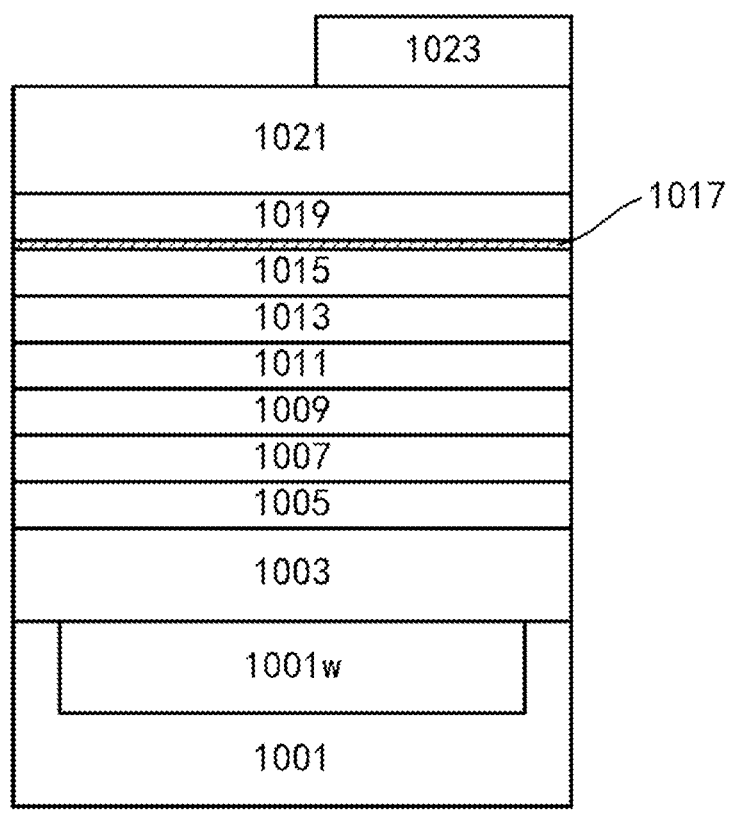

As shown in FIGS. 3(a) and 3(b), a sacrificial layer 1021 may be formed on the hard mask layer 1019 by, for example, deposition. For example, the sacrificial layer 1021 may include polysilicon or amorphous silicon, with a thickness of about 50 to 150 nm. The sacrificial layer 1021 may be patterned by, for example, photolithography. Specifically, a photoresist 1023 may be coated on the sacrificial layer 1021, and the photoresist 1023 may be patterned to have a sidewall extending in a first direction (the horizontal direction in the drawing) through exposure and development. In the top view of FIG. 3(a), a range of the well region 1001w is shown by dashed line. Then, the photoresist 1023 is used as a mask to selectively etch the sacrificial layer 1021, such as reactive ion etching (RIE). The RIE may be stopped at the hard mask layer 1019 to form an etched sacrificial layer (mandrel) 1021, see FIG. 4.

Figure 4:
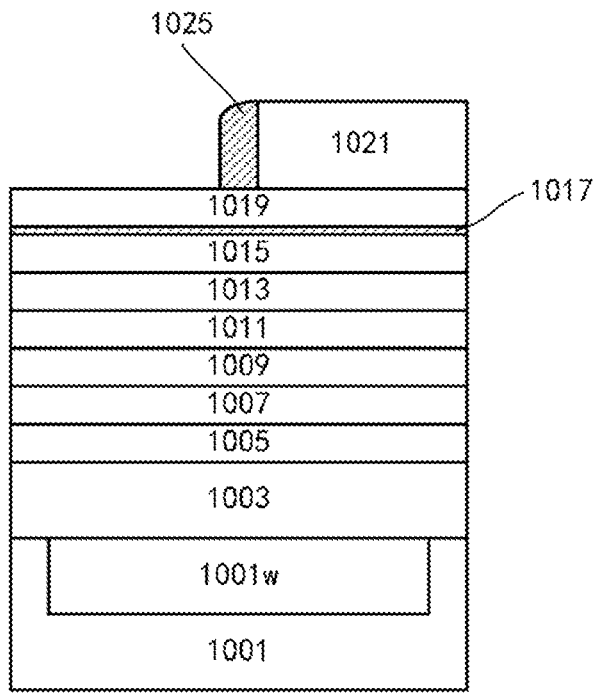

As shown in FIG. 4, a spacer 1025 may be formed on a sidewall of the sacrificial layer 1021 extending along the first direction by a spacer forming process. The spacer 1025 may include oxide with a thickness of about 5 to 60 nm. For example, the spacer 1025 may be formed by depositing a layer of oxide conformally, and then performing RIE on the deposited oxide along a vertical direction, and removing a horizontal extension portion thereof and leaving a vertical extension portion thereof. After that, the sacrificial layer 1021 may be removed by wet etching (for example, using TMAH solution) or dry etching (for example, RIE). Thus, the spacer 1025 extending in the first direction is left.

Figure 5:
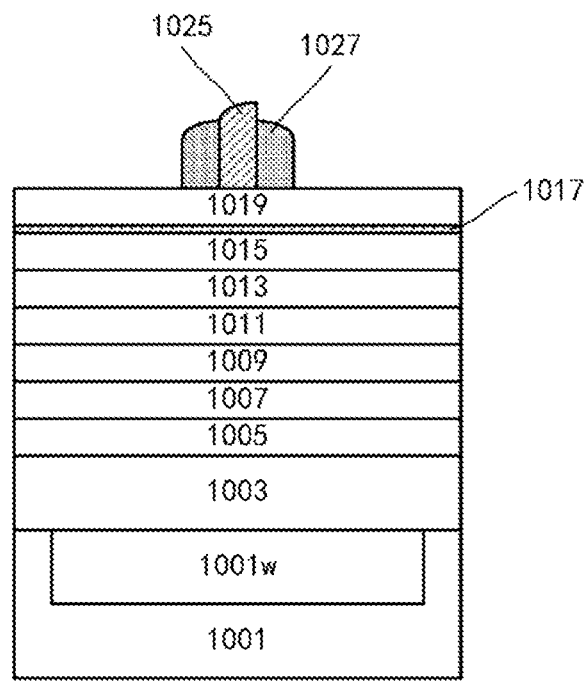

Next, as shown in FIG. 5, spacers 1027 may be formed on opposite sidewalls of the spacer 1025 by the spacer forming process. For example, a spacer 1027 may include SiGe with a thickness of about 10 to 40 nm. Due to characteristics of the spacer forming process, the spacers 1027 may be simultaneously formed on the opposite sidewalls of the spacer 1025 in a same step. Thus, the spacers 1027 extending in the first direction on the opposite sides of the spacer 1025 and adjacent to the spacer 1025 are formed.

Figure 6:
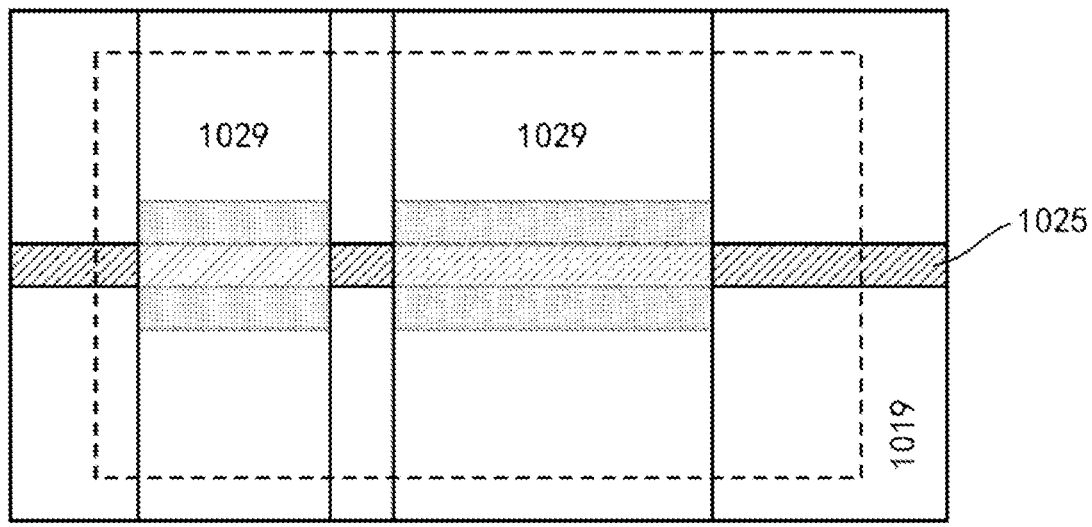

Then, as shown in FIG. 6, a photoresist 1029 may be coated on the structure shown in FIG. 5, and the photoresist 1029 may be patterned to a desired shape through exposure and development. Here, the photoresist 1029 is used to define an area where the device defining portion is located and an area where the contact defining portion is located. Correspondingly, the photoresist 1029 is patterned to cover the spacers 1025 and 1027 in the two areas. In this example, the contact defining portion is formed in the left area, and the device defining portion is formed in the right area. The photoresist 1029 patterned as such may be used to selectively etch the spacers 1027, such as RIE, and the etching may be stopped at the hard mask layer 1019. Therefore, the spacers 1027 are remained in the areas covered by the photoresist 1029. After that, the photoresist 1029 may be removed.

Figure 7:
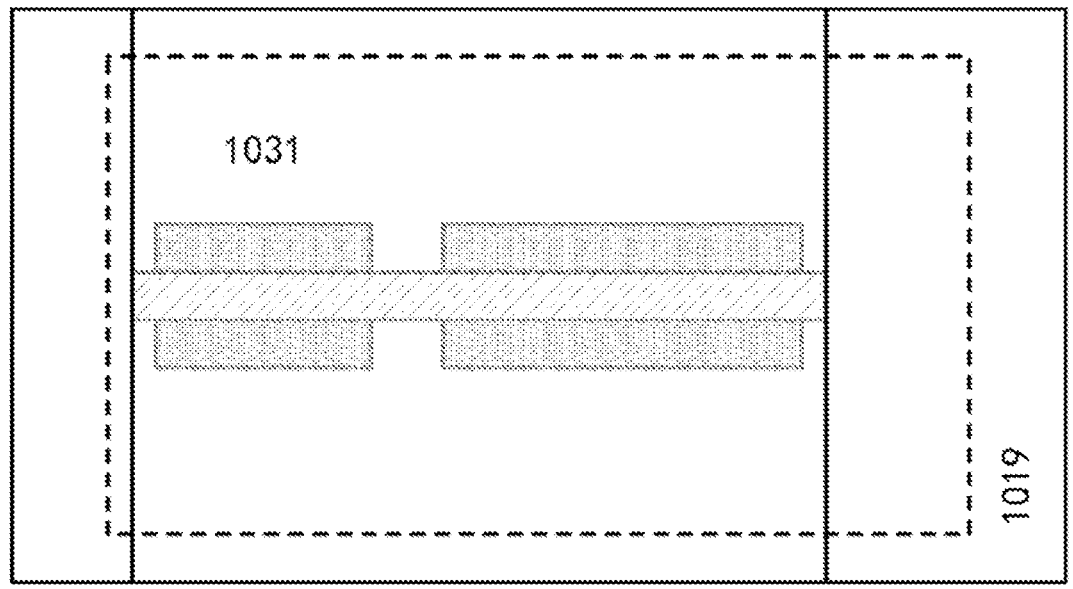

Next, as shown in FIG. 7, a photoresist 1031 may be coated on the structure shown in FIG. 6 (with the photoresist 1029 removed), and the photoresist 1031 may be patterned to a desired shape through exposure and development. Here, the photoresist 1031 is used to define a final hard mask pattern. Correspondingly, the photoresist 1031 covers at least the remaining spacers 1027, a part of the spacer 1025 extending between the remaining spacers 1027, and a part of the spacer 1025 extending between the two areas shown in FIG. 6 (the connecting portion is subsequently defined). In addition, the photoresist 1031 may further cover a part of the spacer 1025 beyond the spacers 1027 at the left end and the right end of the drawing, so as to reduce a change in a channel width of the device (for example, a perimeter of nanowire or nanosheet channel) caused by an overlay of the photolithography. The photoresist 1031 patterned as such may be used to selectively etch the spacer 1025, such as RIE, and the etching may be stopped at the hard mask layer 1019. Therefore, the spacer 1025 is remained in the areas covered by the photoresist 1031. After that, the photoresist 1031 may be removed.

Figure 8A:
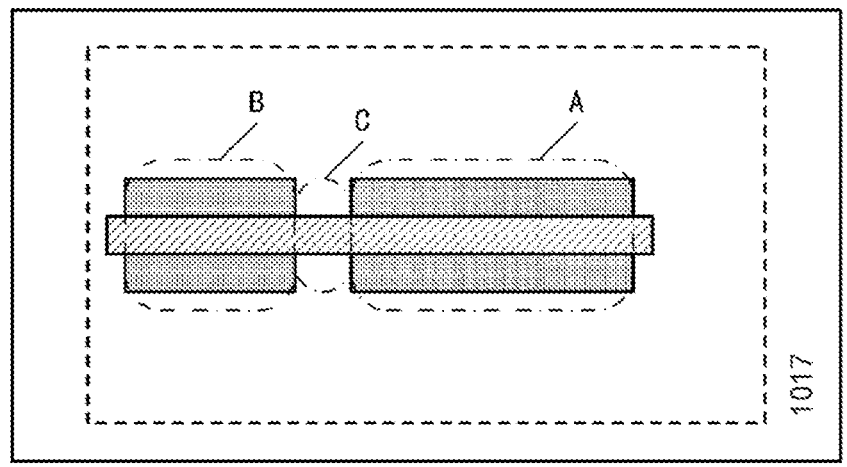

Thus, a pattern shown in FIG. 8(a) is obtained. With reference to FIG. 8(a), the pattern may include three parts: a device defining portion pattern A, which is composed of the spacer 1025 and the spacers 1027 opposite to each other on the opposite sides of the spacer 1025; a contact defining portion pattern B, which is composed of the spacer 1025 and the spacers 1027 opposite to each other on the opposite sides of the spacer 1025; and a connection portion pattern C located between the device defining portion pattern A and the contact defining portion pattern B, which is composed of the spacer 1025. Thus, the whole pattern appears a dumbbell shape.

In this pattern, a width of the device defining portion pattern A (a dimension in the horizontal direction of the drawing) and a width of the contact defining portion pattern B (a dimension in the horizontal direction of the drawing) are both defined by the photoresist 1029, which is irrelevant to a registration error between two times of photolithography. In addition, dimensions of the patterns in the vertical direction are defined by the spacers 1025 and 1027.

Figure 8B:
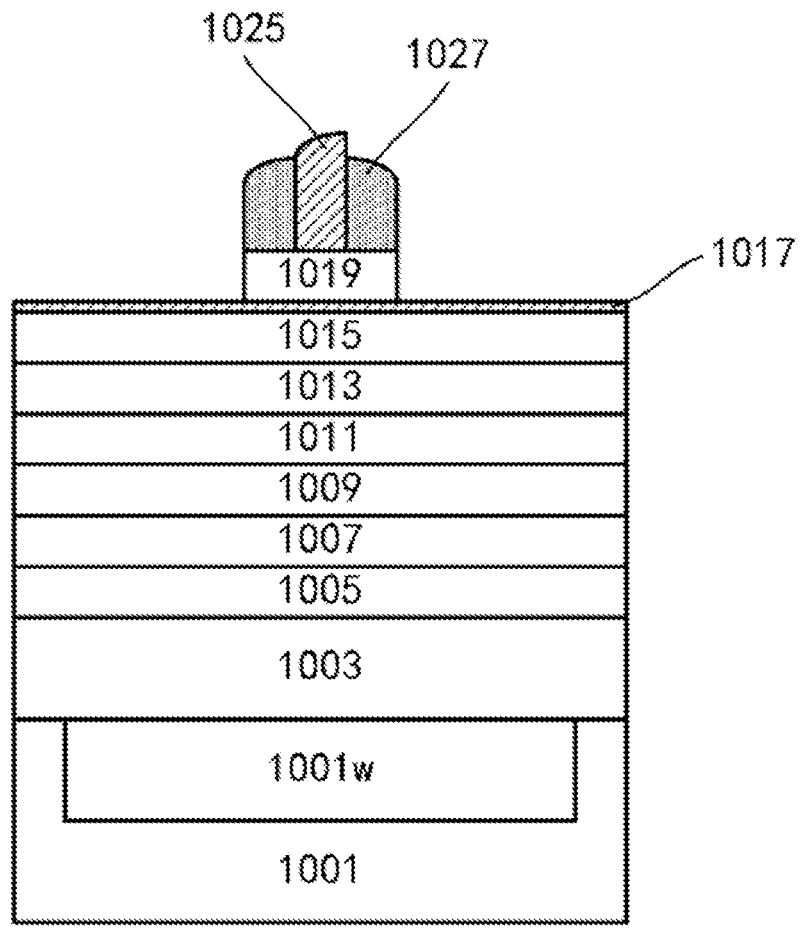
Figure 11A:
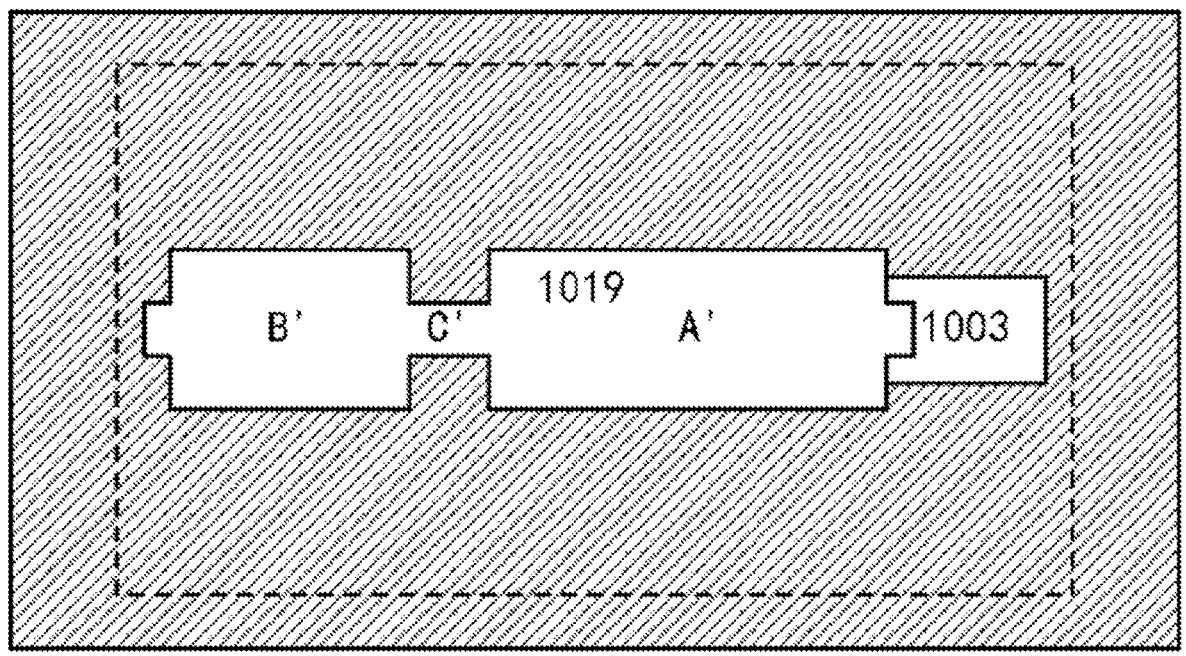

As shown in FIGS. 8(a) and 8(b), the pattern may be transferred to the hard mask layer 1019 below. Specifically, the spacers 1025 and 1027 may be used as masks to selectively etch, such as RIE, the hard mask layer 1019, and the etching may be stopped at the etching stop layer 1017. The RIE may be performed in the vertical direction (for example, substantially perpendicular to the surface of the substrate), so that the hard mask layer 1019 is patterned to be substantially the same as the patterns of the spacers 1025, 1027. With reference to FIG. 11(a), the hard mask layer 1019 includes a device defining portion A' corresponding to the device defining portion pattern A, a contact defining portion B' corresponding to the contact defining portion pattern B, and a connection portion pattern C' corresponding to the connection portion pattern C. By using this pattern transfer technology to pattern the hard mask layer 1019, some limitations and shortcomings of the photolithography technology may be overcome. It should be pointed out here that, in the top view of FIG. 8(a), the etching stop layer 1017 is not marked by a shadow line for clarity only.

After that, the spacers 1025 and 1027 may be removed by selective etching such as RIE. In this example, when removing the SiGe spacer 1027, since the source/drain layer is made of a different semiconductor material Si, an erosion of the source/drain layer may be avoided.

In this example, since the spacers are used for transferring the pattern, the obtained device defining portion A' and the contact defining portion B' are rectangular or square, but the present disclosure is not limited thereto. The device defining portion A' and the contact defining portion B' may be in other suitable shapes, such as circle, ellipse, etc., and may be formed by photolithography.

After that, the hard mask layer 1019 patterned as such may be used to define the active region. For example, this may be done as follows.

Figure 9A:
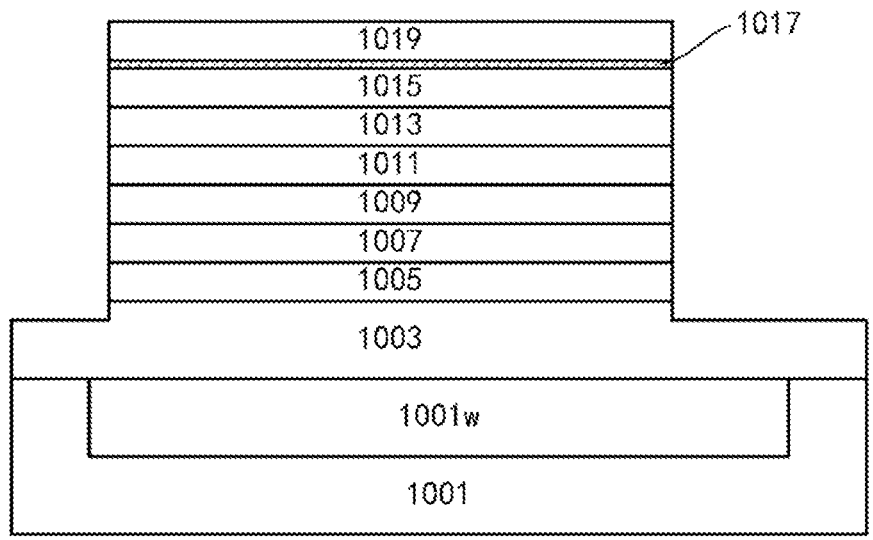
Figure 9B:
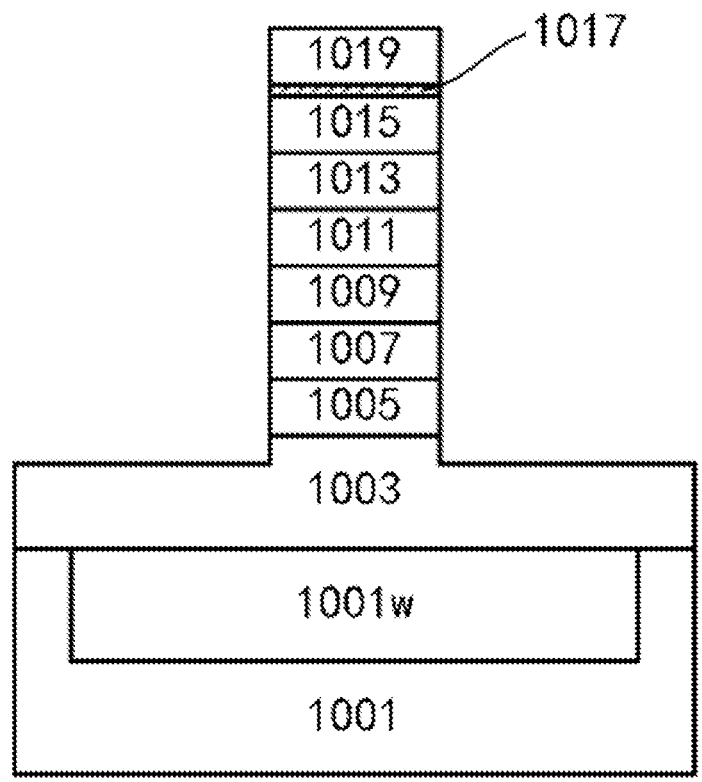

As shown in FIGS. 9(a) and 9(b), the hard mask layer 1019 may be used as a mask to pattern the stack. For example, the etching stop layer 1017, the source/drain layer 1015, the channel layer 1013, the source/drain layer 1011, the channel layer 1009, the source/drain layer 1007, the channel layer 1005 and the source/drain layer 1003 may be sequentially patterned by, for example, RIE in the vertical direction. Here, the etching is not performed to the bottom surface of the lowermost source/drain layer 1003, which facilitates a subsequent manufacture of a contact portion to the source/drain layer 1003.

Figure 10A:
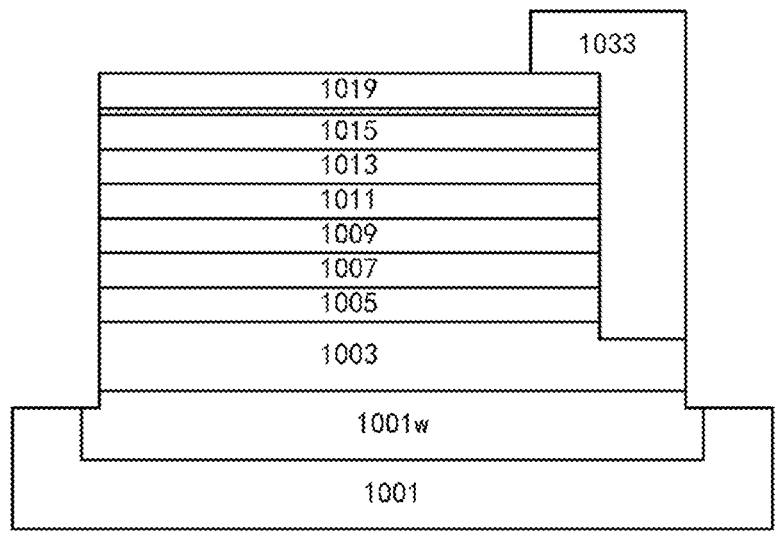
Figure 10B:
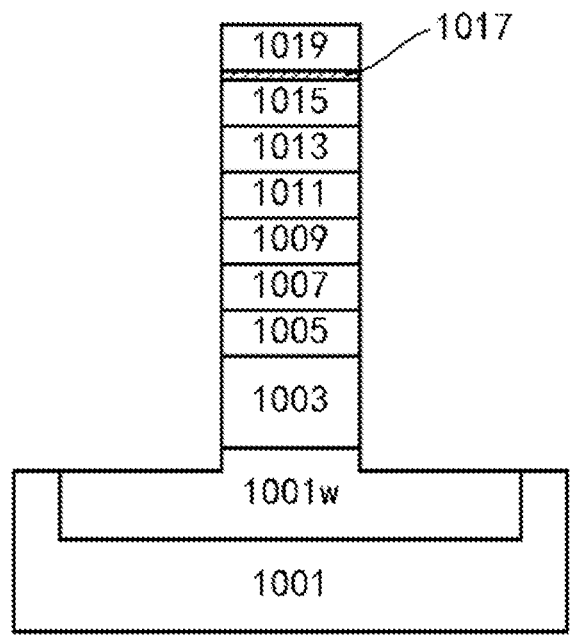

Then, as shown in FIGS. 10(a) and 10(b), the source/drain layer 1003 may be further etched such as RIE in a case that the photoresist 1033 is used to shield a part of the source/drain layer 1003 beyond the hard mask layer 1019. In this way, as shown in FIG. 11(a), the stack is patterned to a dumbbell shape that is substantially the same as the hard mask layer 1019, except that a part of the source/drain layer 1003 (the part shielded by the photoresist 1033) at the bottom is protruded relatively. The protruded part of the source/drain layer 1003 may then be used as a landing pad of the contact portion to the source/drain layer 1003. In order to avoid mutual interference between contact portions formed subsequently, the protruded part of the source/drain layer 1003 is located on an opposite side of the contact defining portion B' with respect to the device defining portion A' of the hard mask layer 1019 (specifically, in this example, the contact defining portion B' is on a left side of the device defining portion A', and the protruded part of the source/drain layer 1003 is on a right side of the device defining portion A'). Here, the etching may be performed into the substrate 1001 (but not to the bottom surface of the well region 1001*w*), so as to make a groove in the substrate 1001, thereby forming a shallow trench isolation (STI) in the groove subsequently. After that, the photoresist 1033 may be removed.

Figure 11B:
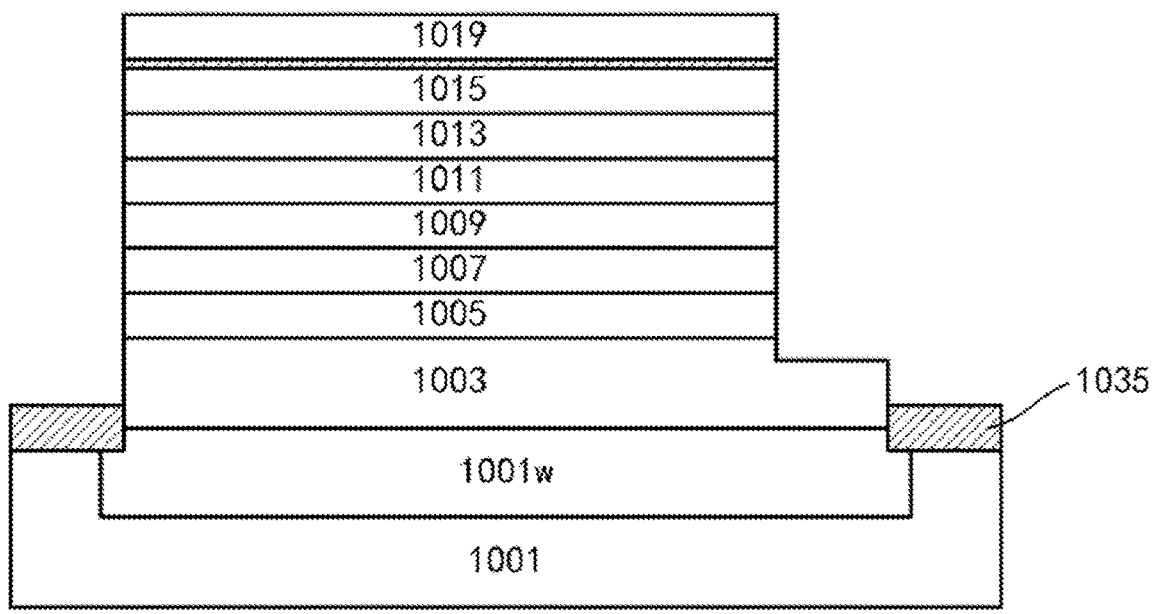
Figure 11C:
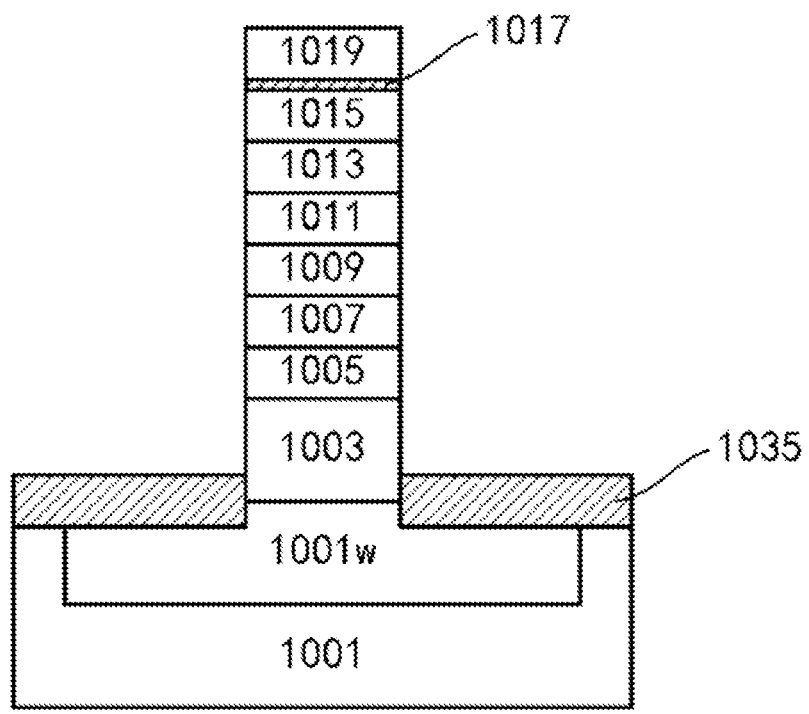

As shown in FIGS. 11(*a*), 11(*b*), and 11(*c*), the groove formed in the substrate 1001 may be filled with a dielectric material to form a STI 1035. For example, the STI 1035 may be formed by depositing oxide, planarizing the oxide such as chemical mechanical polishing (CMP) (which may be stopped at the hard mask layer 1019), and etching back the planarized oxide (for example, wet etching, vapor etching, vapor HF, etc.). The formed STI 1035 surrounds the active region to realize an electrical isolation between the active regions. Here, a top surface of the STI 1035 may be higher than the top surface of the substrate 1001 after the etching back, so that the STI 1035 may shield a lower part of the lowermost source/drain layer 1003.

Through the above processing, the pattern of the hard mask layer 1019 is transferred to the active region. However, the current active region is larger than an active region actually needed, which is mainly to use spaces between the layers to define positions of the gate stacks and the source/drain isolations, so that the gate stacks and the source/drain isolations may be formed in a self-aligned manner. A final active region is mainly located under the device defining portion of the hard mask layer 1019. Therefore, in the following processing, there may be a stage in which a large gap exists under the contact defining portion of the hard mask layer 1019. In order to avoid collapse due to such gap, some supporting ribs may be formed around each semiconductor layer under the contact defining portion.

Figure 12A:
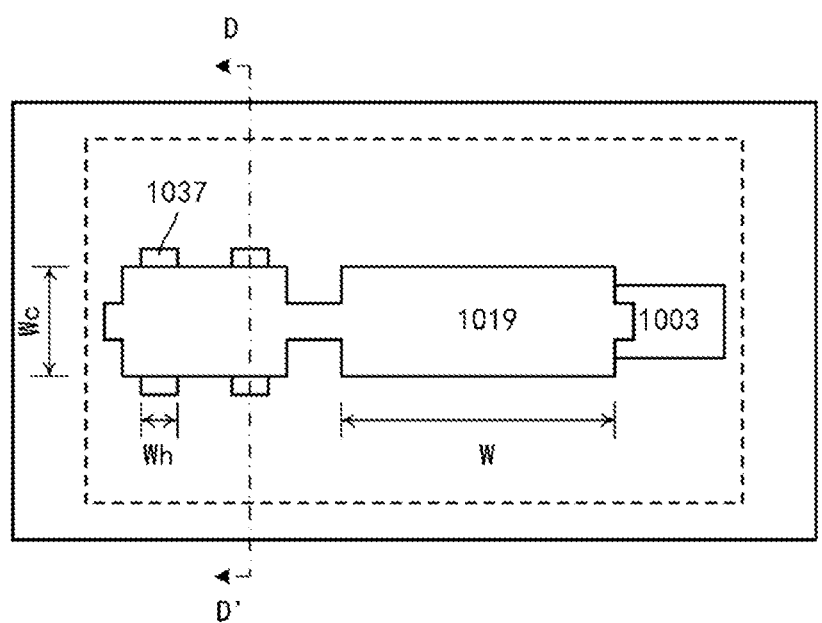
Figure 12B:
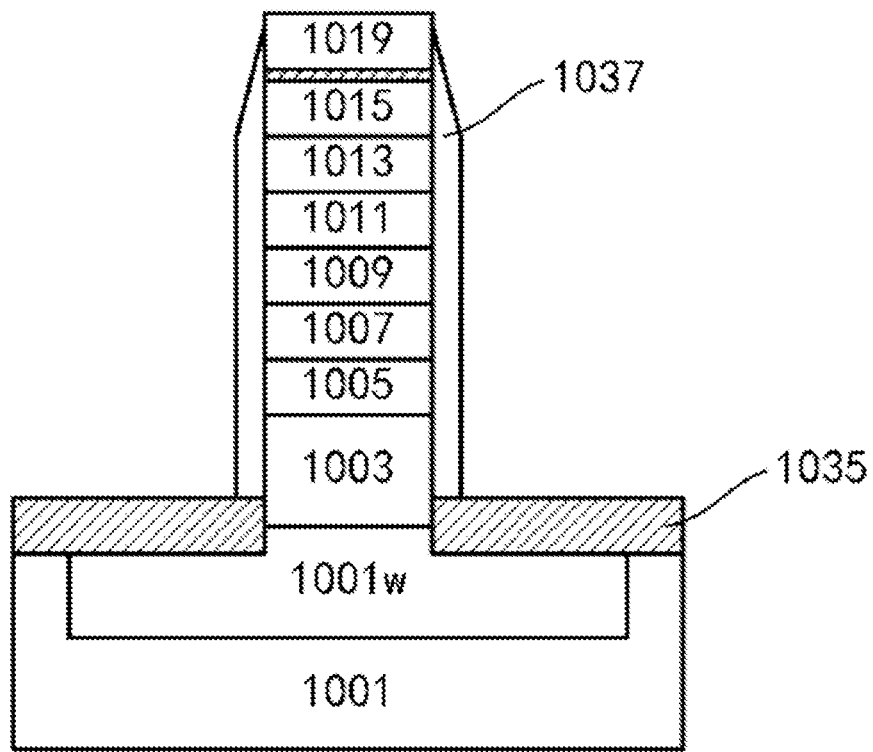
FIG. 12(b) is a sectional view along line DD' in FIG. 12(a)

For example, as shown in FIGS. 12(*a*) and 12(*b*), spacers 1037 may be formed on the sidewalls of each semiconductor layer by the spacer forming technology. For example, a spacer 1037 may include nitride with a thickness of about 2 to 10 nm. Generally, the spacers 1037 surround the sidewalls of each semiconductor layer. The spacers 1037 may be patterned to be remained on the sidewalls of each semiconductor layer under the contact defining portion by photolithography. Here, the spacers 1037 are patterned to be discontinuous, thereby exposing a part of the sidewalls of each semiconductor layer, so as to facilitate further processing of the semiconductor layers. Such spacers 1037 may be used as supporting ribs. Of course, in order to strengthen a supporting function, supporting ribs may also be formed on the sidewalls of the semiconductor layers under the device defining portion. It should be pointed out here that in the top view of FIG. 12(*a*), the STI 1035 is not marked by a shadow line for clarity only, and the same is true for the following top views.

In this example, each support rib 1037 may have an approximately same width Wh. Of course, the present disclosure is not limited thereto, different supporting ribs 1037 may also have different widths. The width Wh of the each supporting rib 1037 is selected to be relatively small, so that in a subsequent etching process, a shielding function of the supporting rib 1037 on the semiconductor layer is weaker than an etching function suffered by a part of the sidewalls of the semiconductor layer exposed to the outside. For example, the width Wh of the supporting rib 1037 may preferably be smaller than the relatively small dimension Wc (a short side of the rectangular pattern) of the contact defining portion.

Figure 13A:
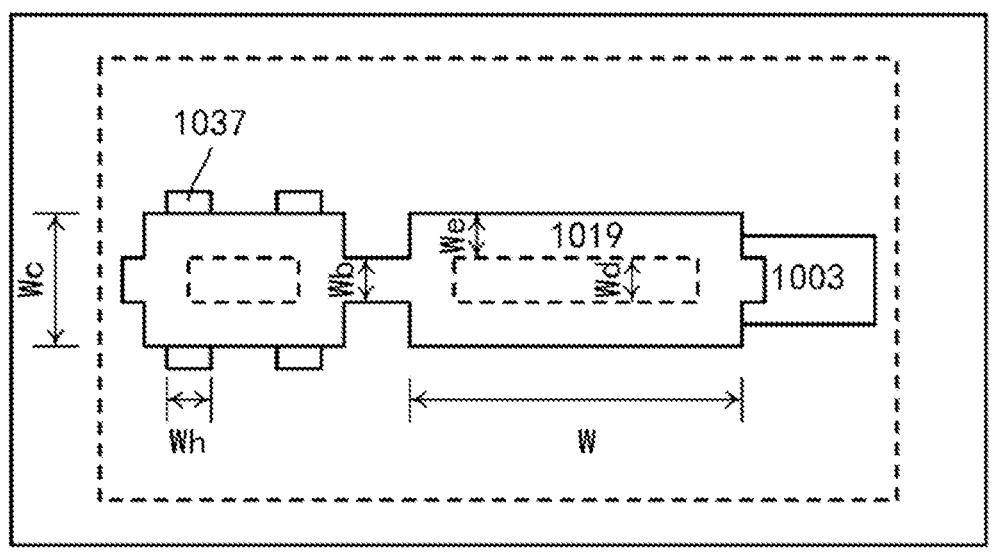
Figure 13B:
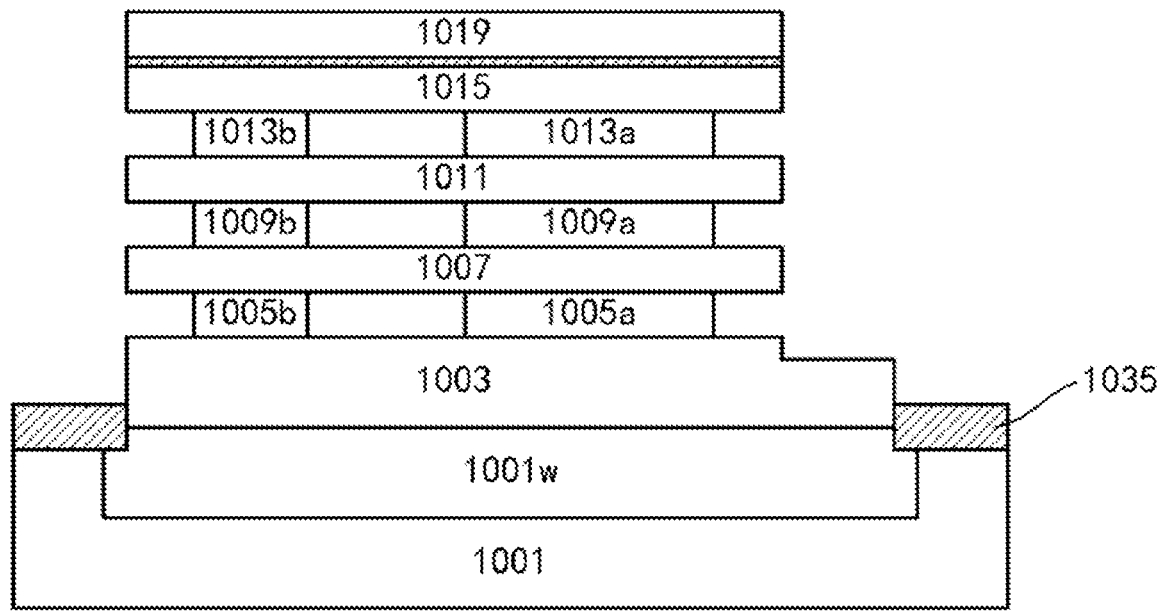
Figure 13C:
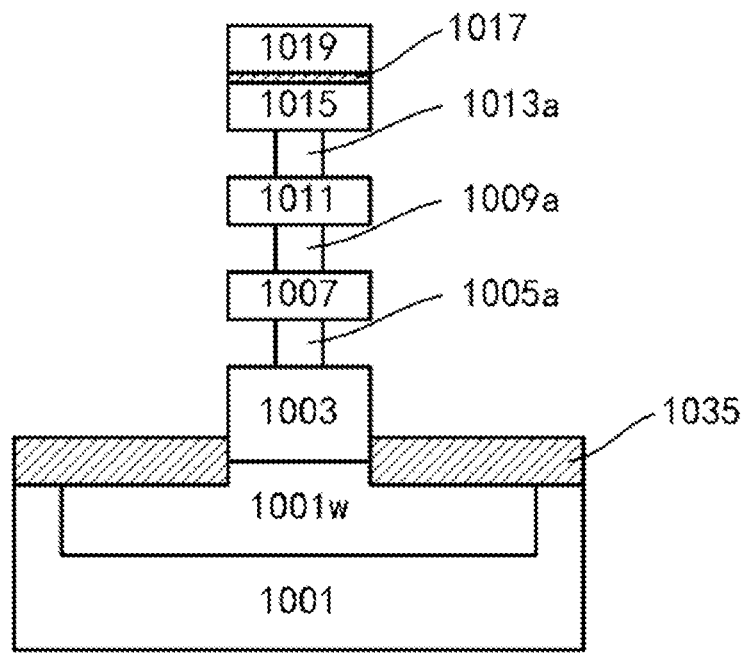

As shown in FIGS. 13(*a*), 13(*b*), and 13(*c*), the channel layers 1005, 1009, and 1013 may be selectively etched. In order to relatively control an etching depth accurately, an atomic layer etching (ALE) may be used here. Then, the channel layers 1005, 1009, and 1013 may be recessed. Here, an etching depth We may be controlled so that parts of the channel layers 1005, 1009, 1013 under the connection portion may be removed, and parts of the channel layers 1005, 1009, 1013 under the device defining portion and the contact defining portion may be partially remained. Thus, the channel layers 1005, 1009, and 1013 are respectively divided into portions 1005*a*, 1009*a*, 1013*a* corresponding to the device defining portion and portions 1005*b*, 1009*b*, 1013*b* corresponding to the contact defining portion. In order to ensure that the parts of the channel layers under the connection portion are etched away, the etching depth is greater than half the width of the connection portion, that is, We>Wb/2. In addition, in order to ensure that parts of the channel layers under the device defining portion and the contact defining portion are not completely etched away, We<Wc/2 (Wc is the length of the short side of the rectangular pattern). In a case that the remaining portions 1005*a*, 1009*a*, and 1013*a* of the channel layers are substantially rectangular (for example, through isotropic etching), the device width may be substantially determined by 2(Wd+W−2We), which is irrelevant to Wb. The dimension W of the device defining portion may be changed, so as to form a nanowire or nanosheet channel device. In addition, a relatively small dimension Wd (the short side of the rectangle) of the portions 1005*a*, 1009*a*, 1013*a* of the channel layers may control electrostatic characteristics of the device such as short channel effect, etc.

The portions 1005*b*, 1009*b*, and 1013*b* of the channel layers under the contact defining portion are useless for the final device and may be removed. This may be done while shielding the portions 1005*a*, 1009*a*, and 1013*a* of the channel layers.

Figure 14A:
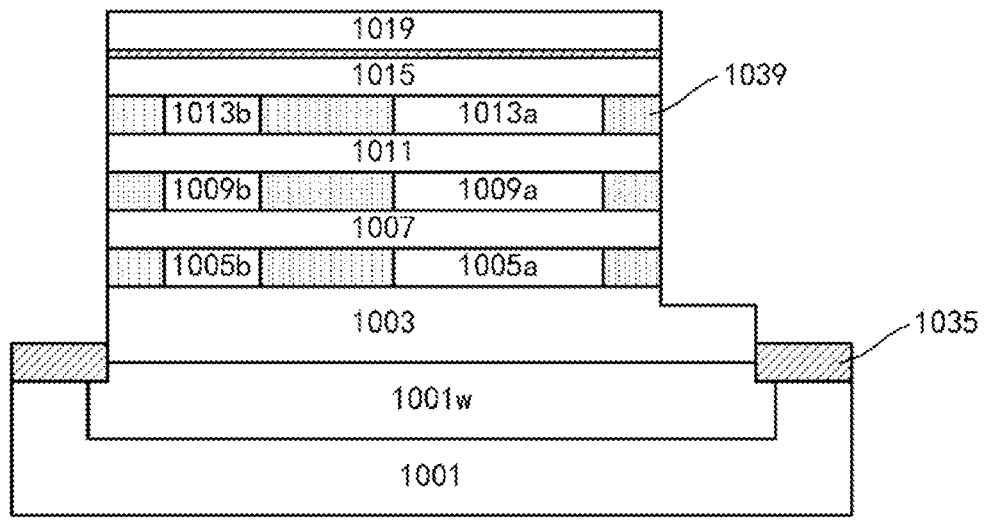
Figure 14B:
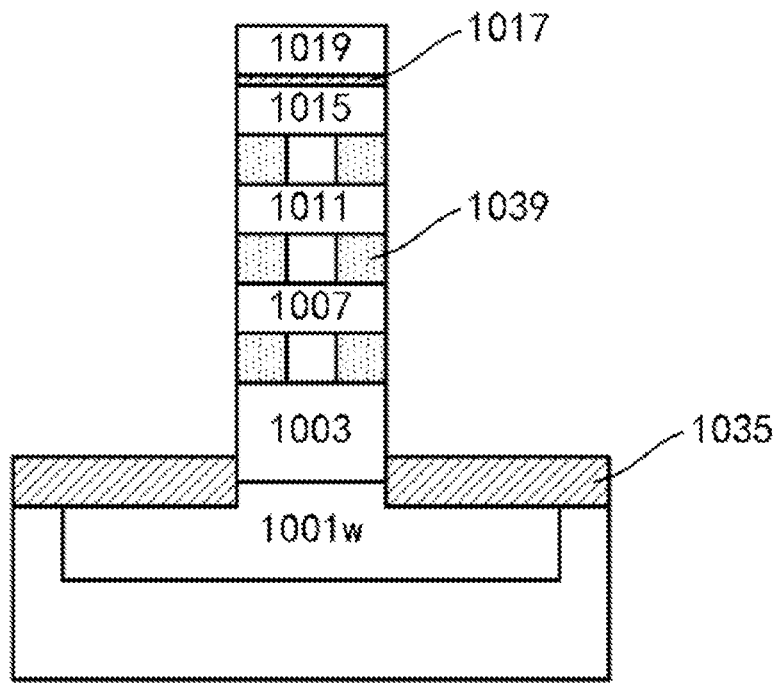

For example, as shown in FIGS. 14(*a*) and 14(*b*), a dielectric material may be used to fill a space left under the hard mask layer due to the partial removal of the channel layers, so as to form a shielding layer 1039. For example, oxynitride (for example, silicon oxynitride) may be deposited on the structures shown in FIGS. 13(*a*), 13(*b*), and 13(*c*), and etched back to form the shielding layer 1039. The etching back may be accomplished by performing RIE in the vertical direction, so that the shielding layer 1039 may be completely under the hard mask layer 1019.

Figure 15A:
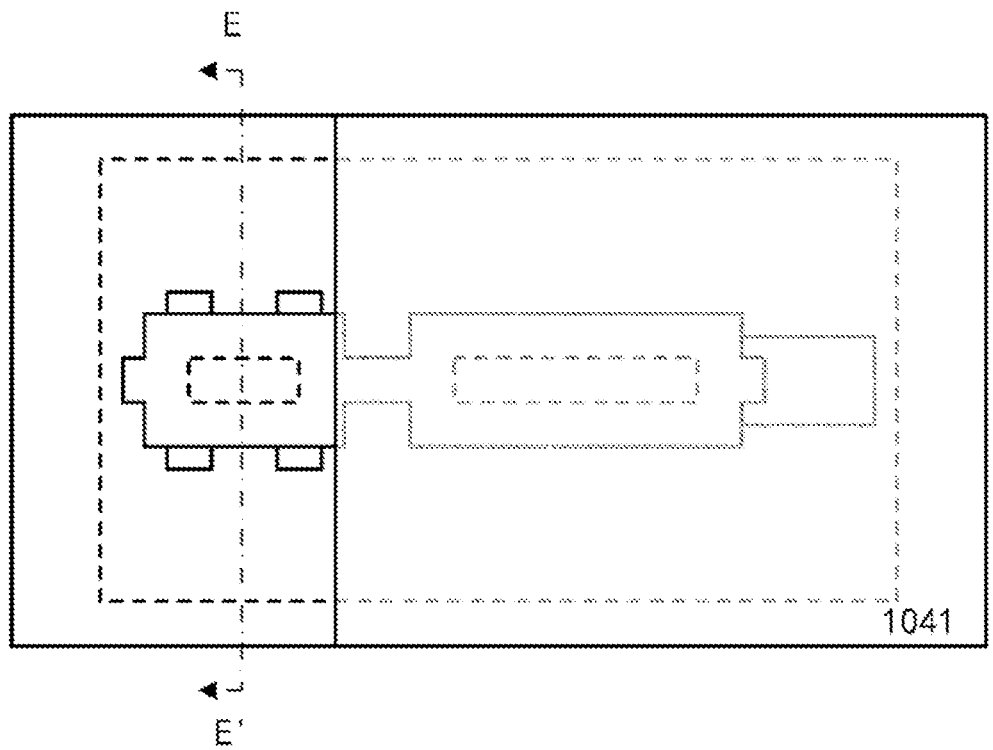
Figure 15B:
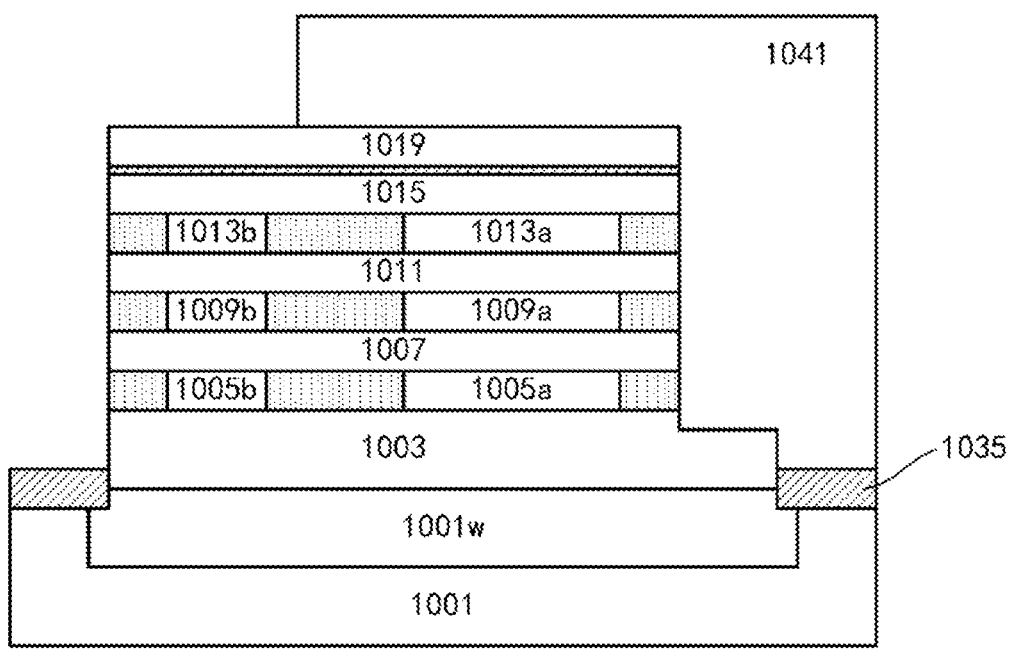
Figure 16A:
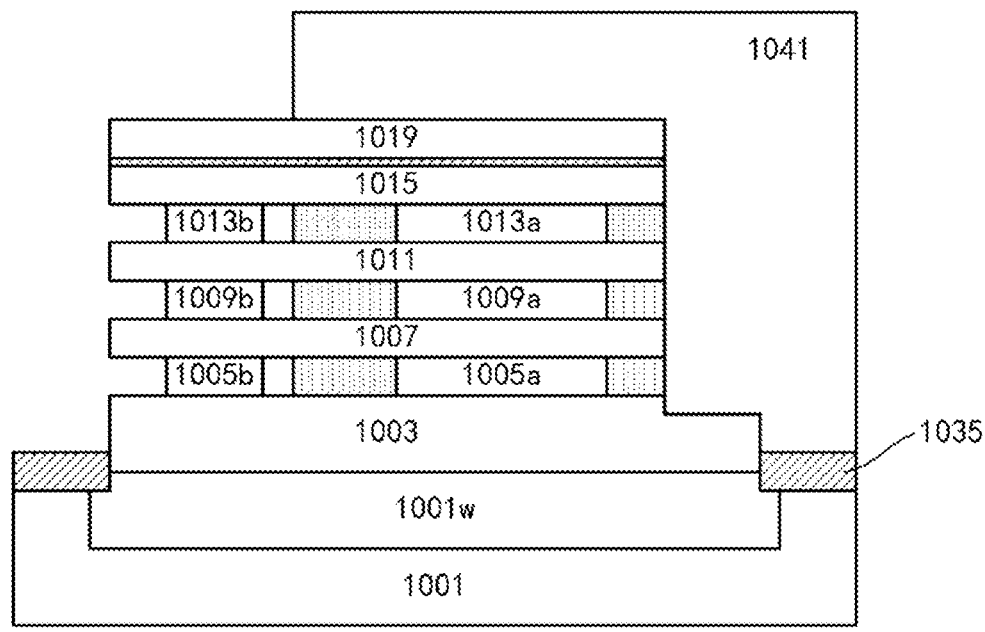
Figure 16B:
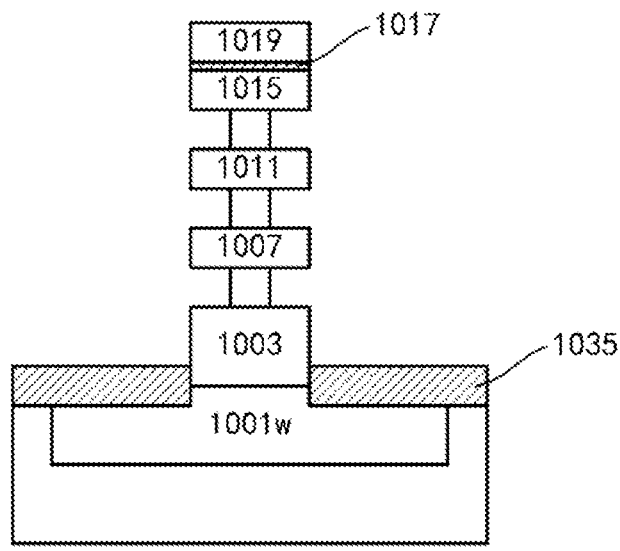
FIGS. 16(b), 17(b), 18(c), and 19(c) are sectional views along line EE' in FIG. 15(a)

The shielding layer 1039 may be patterned to cover the portions 1005*a*, 1009*a*, and 1013*a* of the channel layers, while exposing the portions 1005*b*, 1009*b*, and 1013*b* of the channel layers. For example, as shown in FIGS. 15(*a*) and 15(*b*), a photoresist 1041 may be coated, and the photoresist 1041 may be patterned to cover at least an area where the device defining portion is located and expose an area where the contact defining portion is located by exposure and development. Here, in order to ensure a process margin, the photoresist 1041 overlaps an edge of the contact defining portion. Then, as shown in FIGS. 16(*a*) and 16(*b*), in the presence of the hard mask layer 1019 and the photoresist 1041, the shielding layer 1039 may be selectively etched such as wet etching. In this way, the portions 1005*b*, 1009*b*, and 1013*b* of the channel layers under the contact defining portion are exposed. After that, the photoresist 1041 may be removed.

Figure 17A:
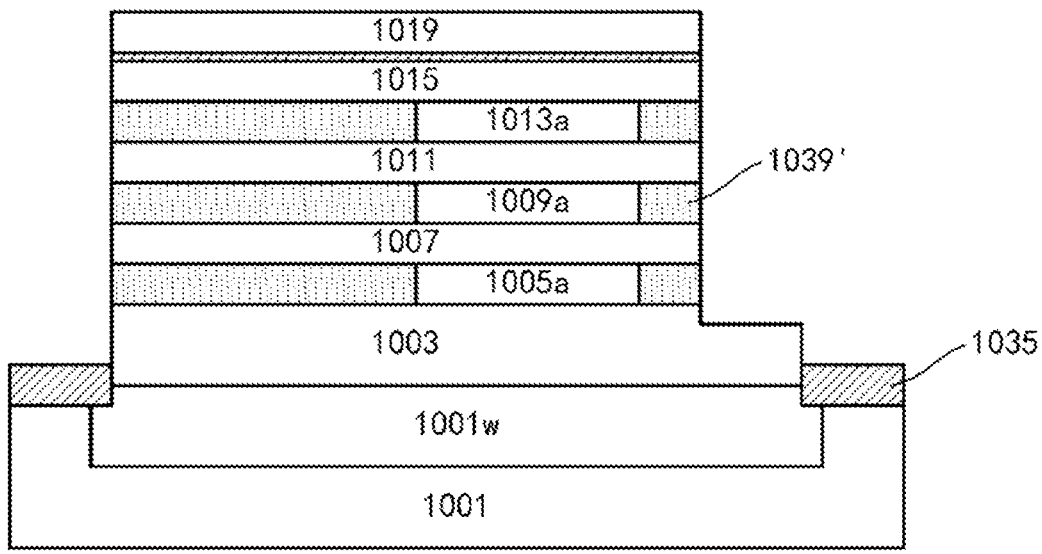
Figure 17B:
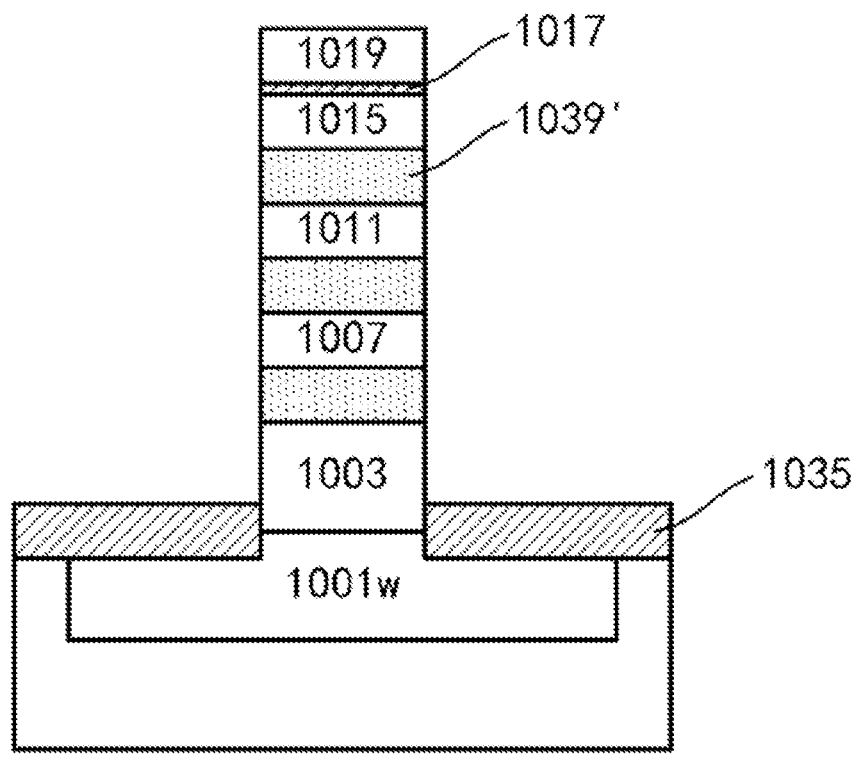

As the portions 1005*b*, 1009*b*, and 1013*b* of the channel layers are exposed, they may be removed by selective etching such as wet etching, while the portions 1005*a*, 1009a, and 1013a of the channel layers are shielded by the shielding layer 1039 so that the portions 1005a, 1009a, and 1013a may be remained. After the portions 1005b, 1009b, and 1013b of the channel layers are removed, the source/drain layers under the contact defining portion are spaced apart from each other, and the supporting ribs 1037 facilitate preventing the source/drain layers from collapsing. The gaps between the source/drain layers may be further filled with dielectric, as shown in FIGS. 17(a) and 17(b). Here, in order to facilitate a subsequent processing, the filled dielectric is the same as the shielding layer 1039, so as to occupy the spaces between the source/drain layers together with the previous shielding layer 1039 (marked as 1039') and defines a position of a subsequently formed gate stack. It may also be referred to as a gate stack position defining portion.

Figure 18A:
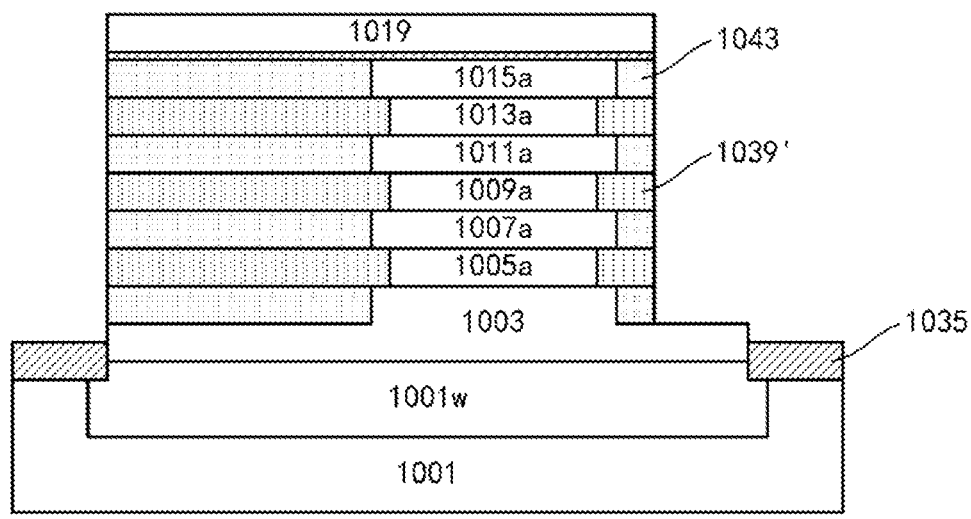
Figure 18B:
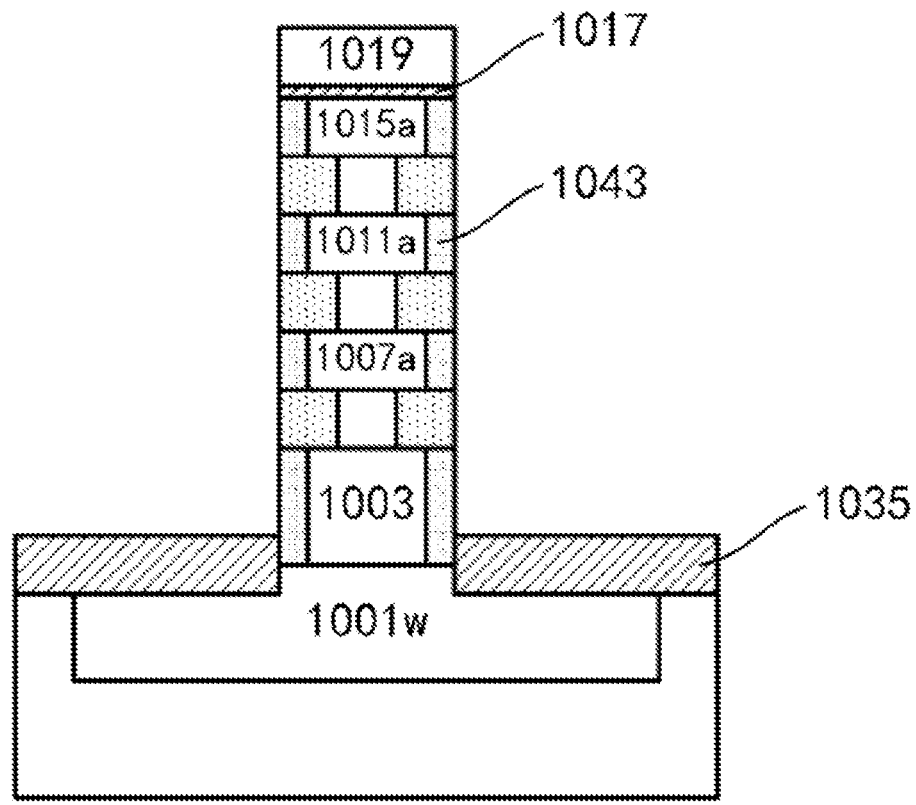
Figure 18C:
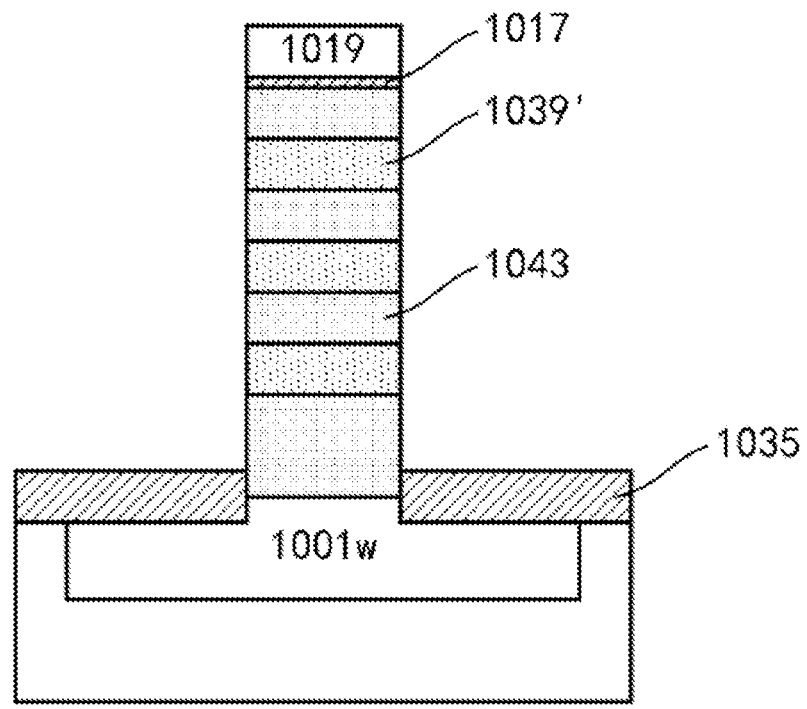

The source/drain layers may be processed similarly, so that they are remained under the device defining portion. For example, the source/drain layers may be preliminarily selectively etched, parts of the source/drain layers under the connection portion are removed, and thus the source/drain layers are divided into parts under the device defining portion and parts under the contact defining portion. Similarly, the shielding layer is used to shield the parts of the source/drain layers under the device defining portion, and the parts of the source/drain layers under the contact defining portion are removed by selective etching. Thus, as shown in FIGS. 18(a), 18(b), and 18(c), portions 1007a, 1011a, and 1015a of the source/drain layers under the device defining portion are remained. It should be noted here that since the lowermost source/drain layer 1013 is relatively thick, the lowermost source/drain layer 1013 is not separated, and only a part of the lowermost source/drain layer 1013 is thinned. More specifically, an upper part of the source/drain layer 1013 may be remained under the device defining portion, and a lower part of the source/drain layer 1013 may be continuously extended. The protruded part of the source/drain layer 1013 is remained protruding after etching. Gaps left by the removal of the source/drain layers may be filled with dielectric, thereby forming isolation portions 1043 for the source/drain layers. The isolation portions 1043 formed as such are self-aligned to the source/drain layers. For example, the isolation portions 1043 may include SiC, especially low-k SiC.

Figure 19A:
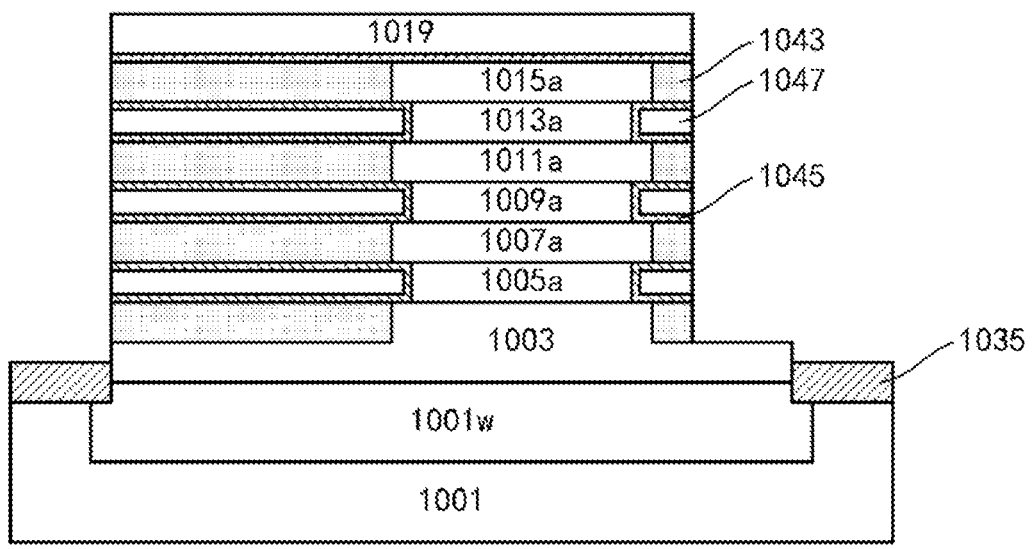
Figure 19B:
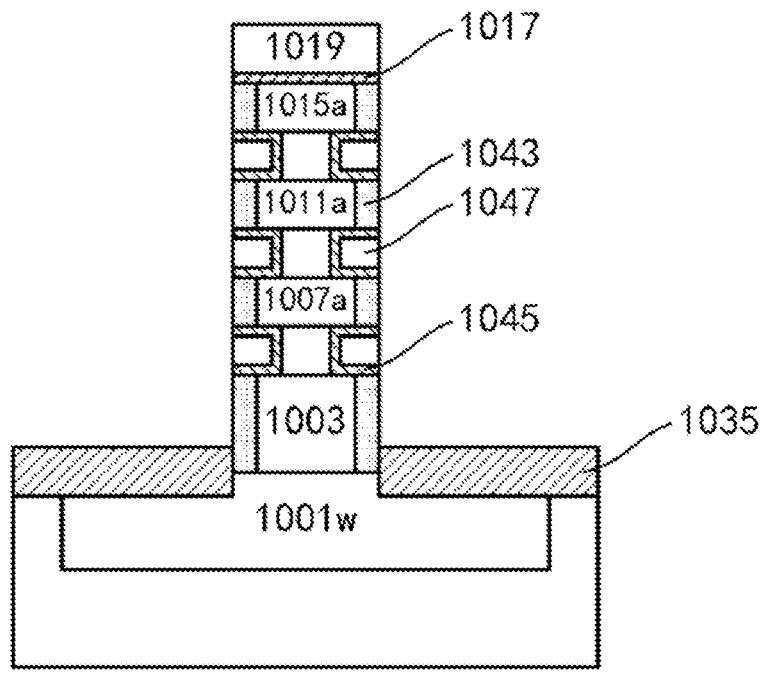
Figure 19C:
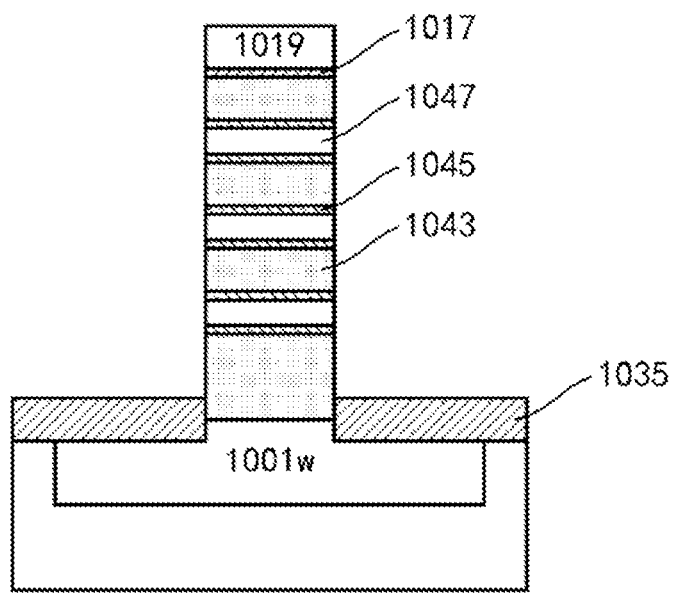

After that, a replacement gate process may be performed. For example, as shown in FIGS. 19(a), 19(b), and 19(c), the gate stack position defining portion 1039' may be removed by selective etching, so as to release the space occupied by the gate stack position defining portion 1039' and form a gate stack in the released space. Specifically, a gate dielectric layer 1045 and a gate conductor layer 1047 may be sequentially deposited on the structures shown in FIGS. 18(a), 18(b), and 18(c) (the gate stack position defining portion 1039' is removed), and the deposited gate conductor layer 1047 (and optionally, the gate dielectric layer 1045) is etched back. The etching back may be performed by performing RIE in the vertical direction. Thus, the gate stack may be left under the hard mask layer 1019, and a peripheral sidewall of the gate stack may be substantially coplanar with a peripheral sidewall of the hard mask layer 1019. For example, the gate dielectric layer 1045 may include a high-k gate dielectric such as HfO2; and the gate conductor layer 1047 may include a metal gate conductor. In addition, a function adjustment layer may also be formed between the gate dielectric layer 1045 and the gate conductor layer 1047. Before forming the gate dielectric layer 1045, an interface layer such as oxide may also be formed. The gate stack formed as such is self-aligned to the channel layer.

It may be seen that the gate stack may be consistent with the pattern of the hard mask layer 1019. Accordingly, the gate stack may include a main body under the device defining portion of the hard mask layer 1019, an end portion under the contact defining portion of the hard mask layer 1019, and a connection portion under the connection portion of the hard mask layer 1019. The main body at least partially surrounds the periphery of the corresponding channel layer. The connection portion is connected between the main body and the end portion, and a periphery of the connection portion is recessed relative to peripheries of the main body and the end portion.

So far, the manufacturing of the unit device is substantially completed. Then, the contact portion may be manufactured to realize a required electrical connection. To facilitate connection to each gate stack, the shape of the gate stack may be adjusted. Specifically, an upper gate stack may be exposed a lower gate stack.

Figure 20:
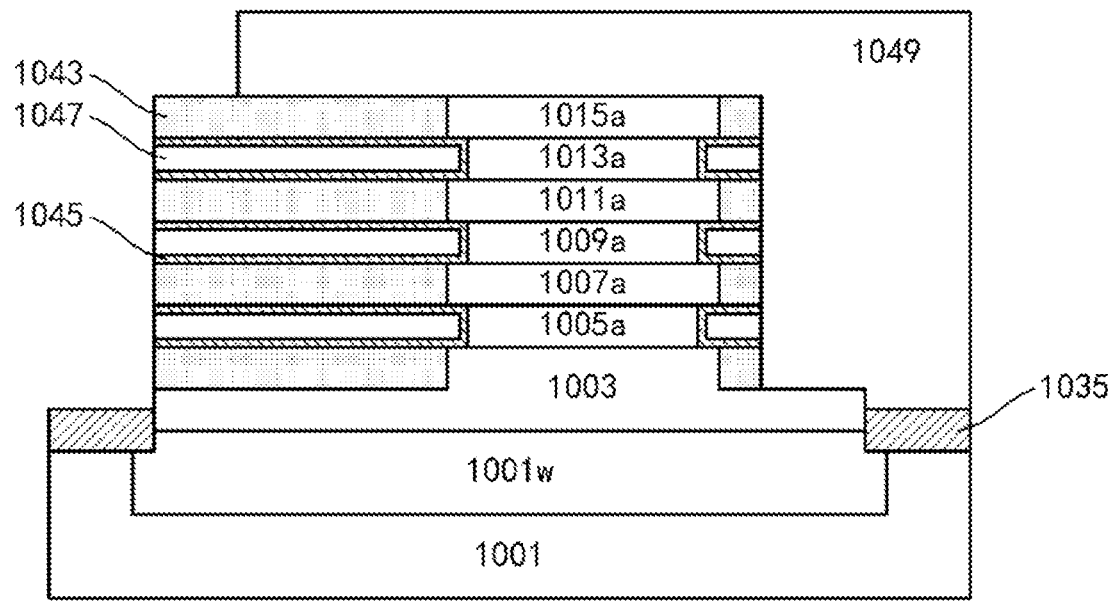
Figure 21:
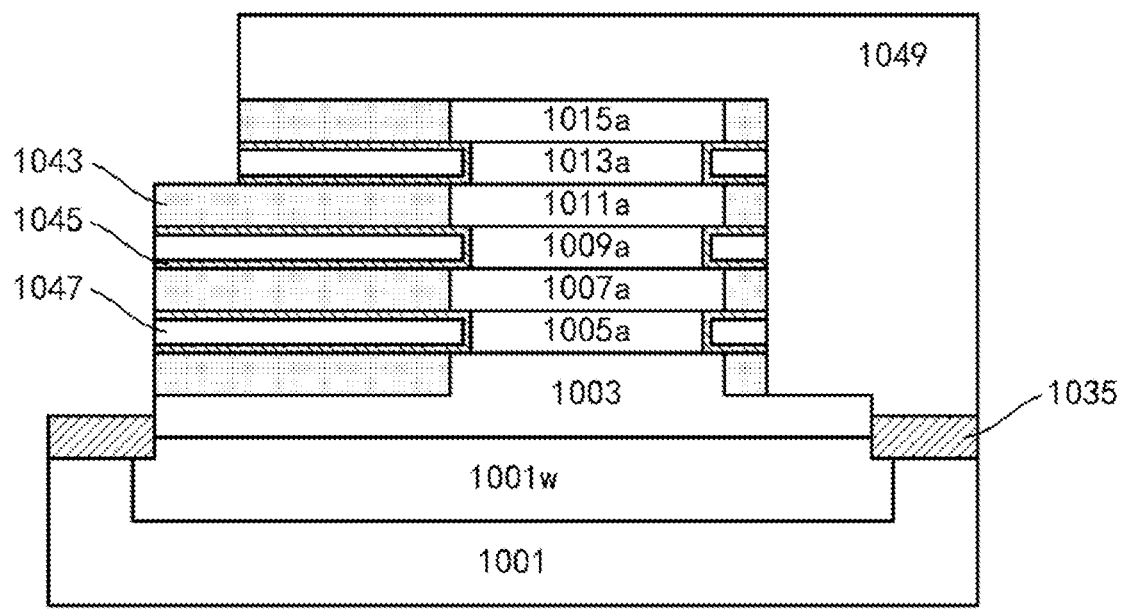
Figure 22:
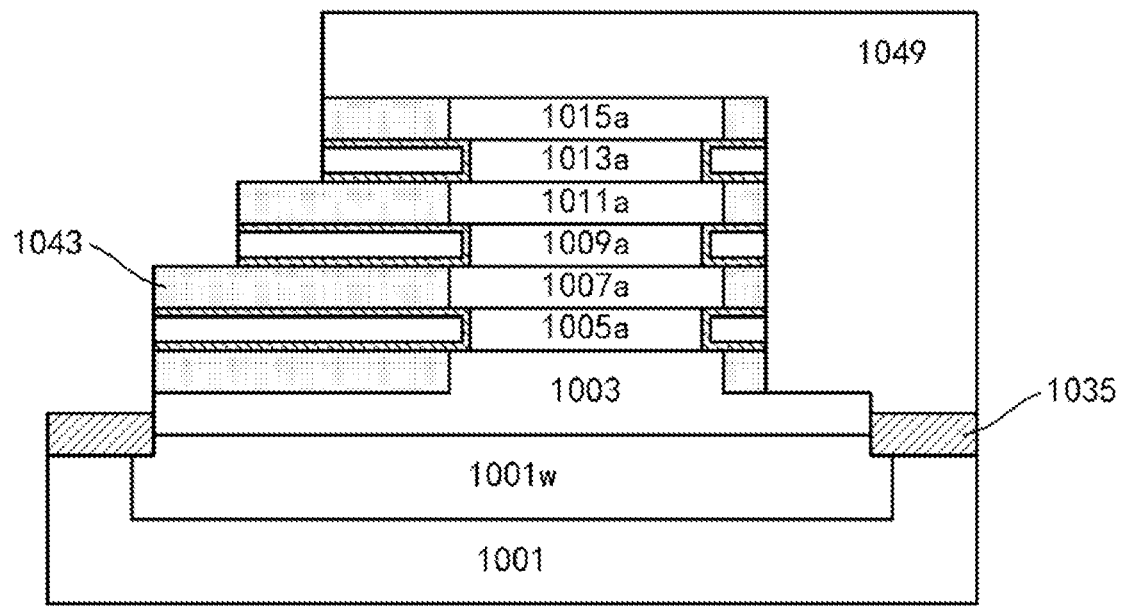
Figure 23:
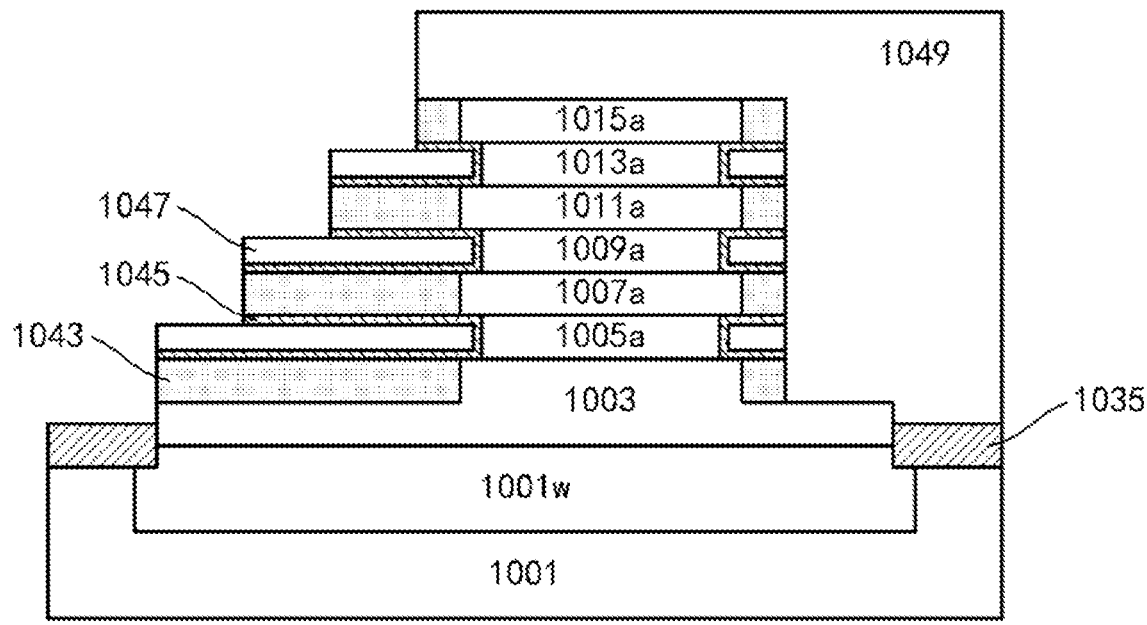

As shown in FIG. 20, in order to facilitate the subsequent patterning, the hard mask layer 1019 and the etching stop layer 1017 may be removed by selective etching such as RIE. A photoresist 1049 may be coated and patterned to expose a part of the end portion of the gate stack through exposure and development. Next, as shown in FIG. 21, an isolation portion 1043, a gate dielectric layer, a gate conductor layer, and a gate dielectric layer in a top layer may be selectively etched sequentially by RIE, and the etching may be stopped at an isolation portion 1043 in a second layer. As shown in FIG. 22, the photoresist 1049 may be trimmed to shrink back, and the isolation portion and the gate stack may be selectively etched by RIE similarly, the etching may be stopped at an isolation portion 1043 below. As shown in FIG. 23, the photoresist 1049 may be trimmed again to shrink it, the isolation portion and the gate dielectric layer may be selectively etched by RIE similarly, and the etching may be stopped at the gate conductor layer. Through this operation, the gate stacks are in a step form at the edge, and an upper gate stack is retracted relative to a lower gate stack and thus the lower gate stack is exposed. After each gate stack is etched, it still has a sufficiently large end portion to facilitate a formation of a contact portion thereon. After that, the photoresist 1049 may be removed.

Figure 24:
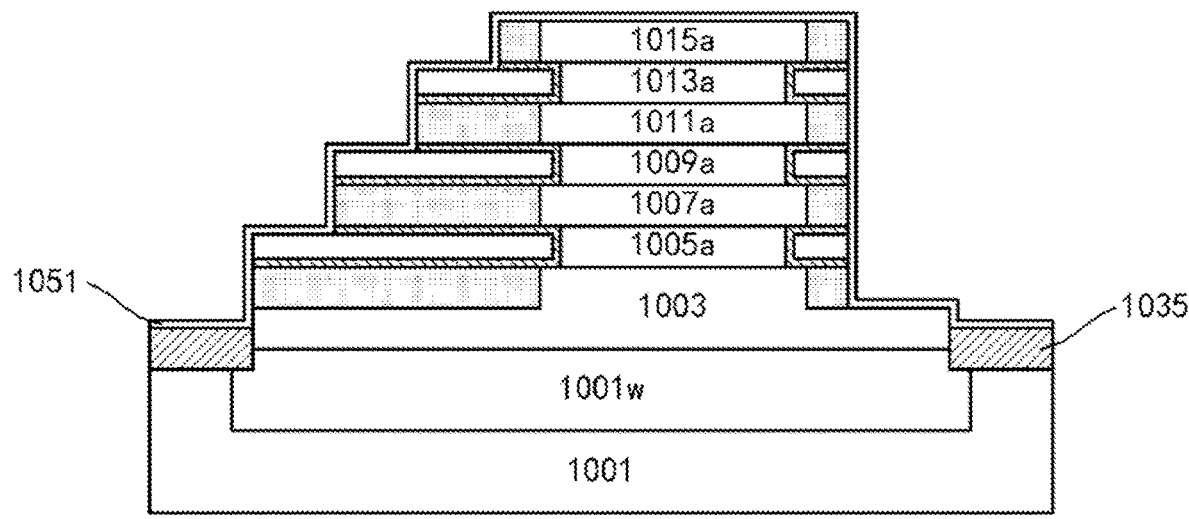

In order to better control the etching when forming the contact portion, as shown in FIG. 24, a liner layer 1051 may be formed on the structure shown in FIG. 23 (with the photoresist 1049 removed) by, for example, deposition. For example, the liner layer 1051 may include nitride with a thickness of about 5 to 20 nm. The liner layer 1051 may function as a protection layer and an etching stop layer.

Figure 25:
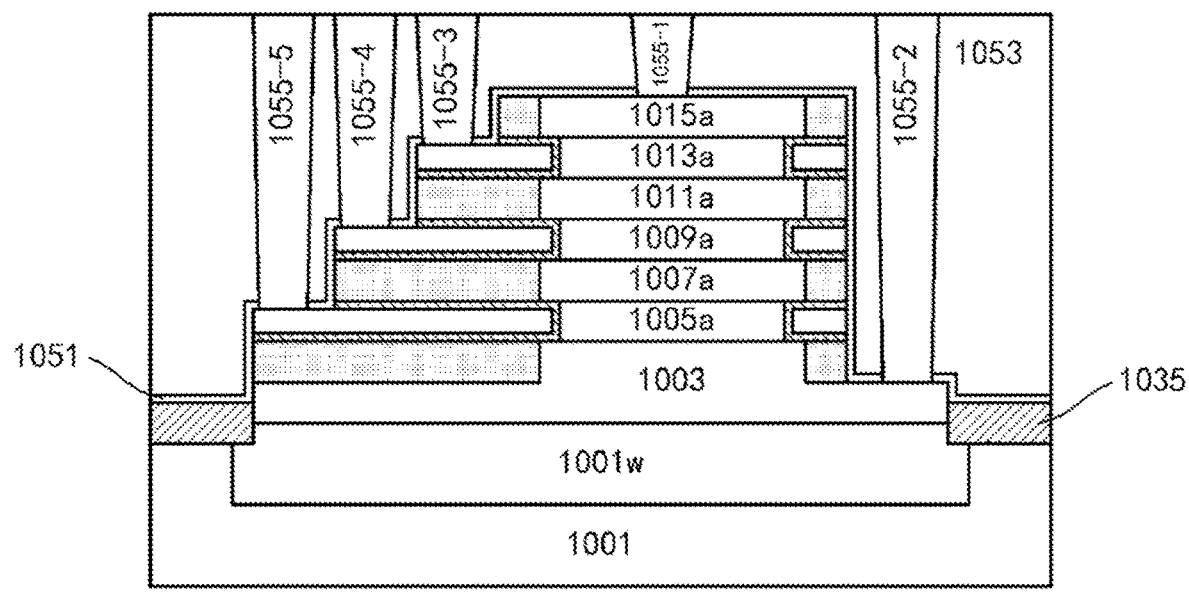

Then, as shown in FIG. 25, an interlayer dielectric layer 1053 may be formed on the structure shown in FIG. 24 by, for example, deposition. For example, an oxide may be deposited and planarized such as CMP to form the interlayer dielectric layer 1053. In the interlayer dielectric layer 1053, a contact portion 1055-1 to the uppermost source/drain layer 1015a, a contact portion 1055-2 to the lowermost source/drain layer 1003, and contact portions 1055-3, 1055-4, 1055-5 to various gate stacks, respectively, may be formed. These contact portions may be formed by etching holes and filling them with conductive materials such as metals. When etching the interlayer dielectric layer 1053, the etching may be stopped at the liner layer 1051, so that the etching of contact holes in the interlayer dielectric layer 1053 may be better controlled.

As shown in FIG. 25, the semiconductor device according to the embodiments includes three unit devices: a lowermost unit device, including a channel region formed in the channel layer 1005a, source/drain regions formed in the source/drain layers 1003 and 1007a and located on the upper and lower sides of the channel region, respectively, and a gate stack formed around the channel layer 1005a; a middle unit device, including a channel region formed in the channel layer 1009a, source/drain regions formed in the source/drain layers 1007a and 1011a and located on the upper and lower sides of the channel region, respectively, and a gate stack formed around the channel layer 1009a; an uppermost unit device, including a channel region formed in the channel layer 1013a, source/drain regions formed in the source/drain layers 1011a and 1015a and located on the upper and lower sides of the channel region, respectively, and a gate stack formed around the channel layer 1013a. The unit devices are stacked on each other and connected in series with each other due to shared source/drain layers or source/drain regions between adjacent unit devices. In addition to these source/drain regions connected to each other, the uppermost source/drain region and the lowermost source/drain region may be electrically connected through the corresponding contact portions 1055-1 and 1055-2, and various gate stacks may be electrically connected through the corresponding contact portions 1055-3, 1055-4, and 1055-5.

Figure 26:
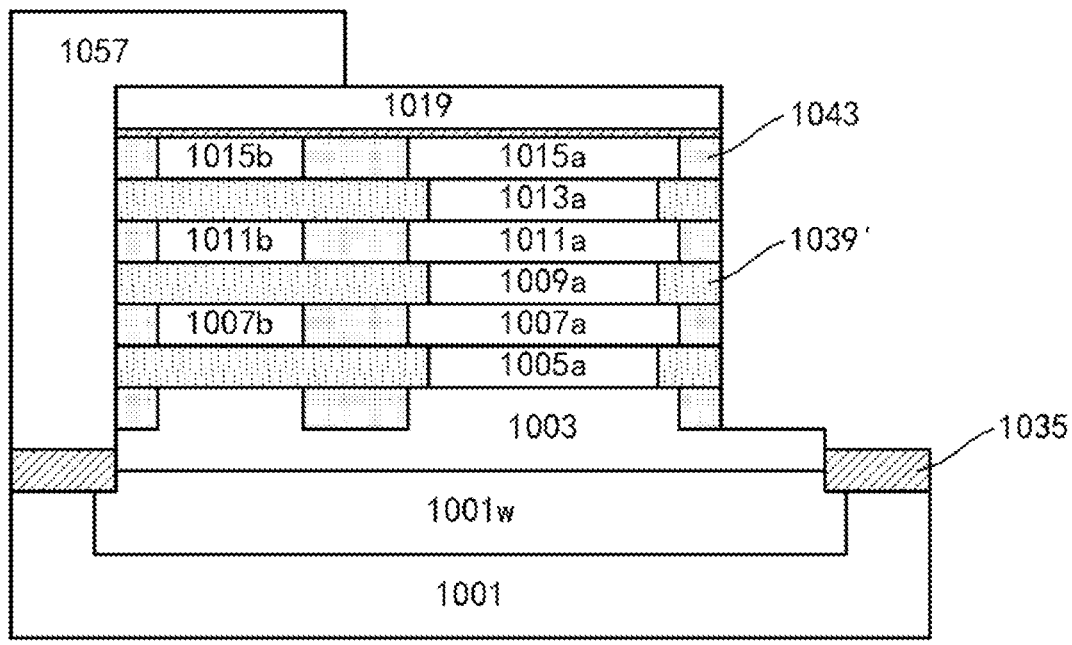
FIGS. 26 to 28 show schematic views of some stages in a process of manufacturing a semiconductor device according to the embodiments of the present disclosure.
Figure 27:
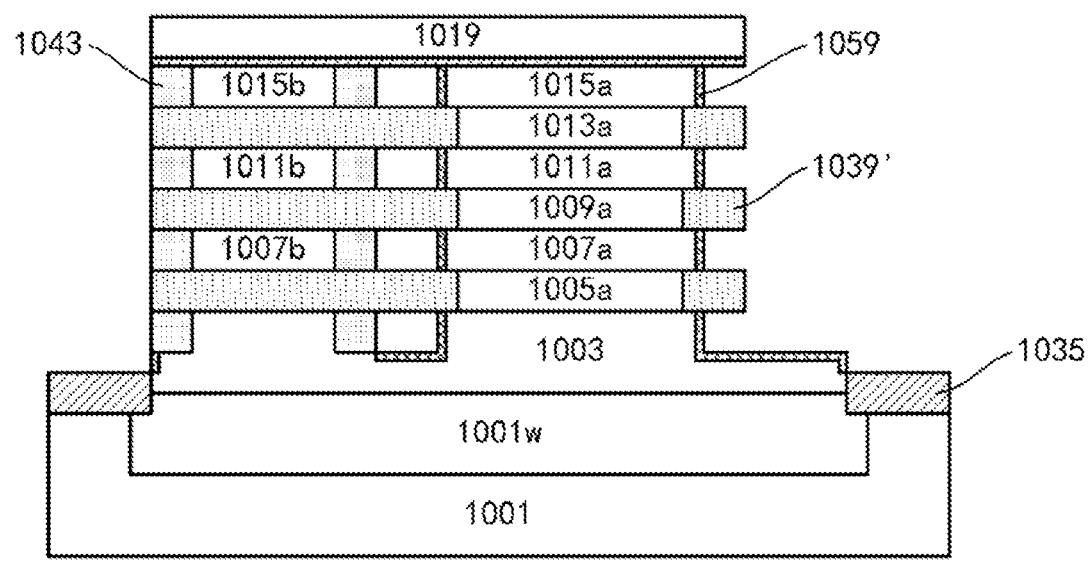
Figure 28:
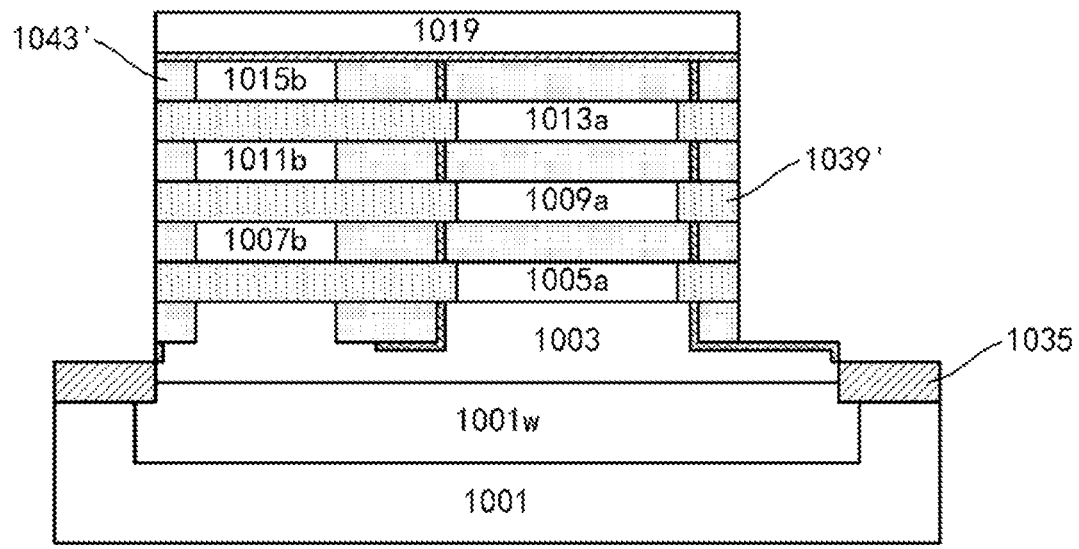

FIGS. 26 to 28 show schematic views of some stages in the process of manufacturing the semiconductor device according to the embodiments of the present disclosure.

When processing the source/drain layer as described above in conjunction with FIGS. 18(a), 18(b) and 18(c), the source/drain layer is preliminarily selectively etched to separate it into a part under the device defining portion device and a part under the contact defining portion, after that, the gap under the hard mask layer 1019 is filled with a shielding layer. Then, instead of removing the part of the source/drain layer under the contact defining portion directly as described above in conjunction with FIGS. 18(a), 18(b) and 18(c), it is possible to form metal silicide on the part of the source/drain layer under the device defining portion to improve an electrical contact. This may be performed by using the shielding layer to shield the part of the source/drain layer under the contact defining portion and expose the part of the source/drain layer under the device defining portion, and siliconizing the exposed part of the source/drain layer.

For example, as shown in FIG. 26, a photoresist 1057 may be coated, and the photoresist 1057 may be patterned to cover at least the area where the contact defining portion is located through exposure and development, and to expose the area where the device defining portion is located. Then, as shown in FIG. 27, in the presence of the hard mask layer 1019 and the photoresist 1057, the shielding layer 1043 may be selectively etched, such as wet etching. In this way, the portions 1003, 1007a, 1011a, and 1015a of the source/drain layer under the device defining portion are exposed. After that, the photoresist 1057 may be removed.

The exposed portions 1003, 1007a, 1011a, and 1015a of the source/drain layer may be siliconized to form a silicide layer 1059 on surfaces thereof. For example, a metal layer such as NiPt may be deposited and annealed to cause a silicide reaction between the metal and the semiconductor material of the source/drain layer, so as to form a silicide layer. After that, unreacted remaining metal layer may be removed. Although the silicide layer is shown as a thin layer on the surfaces of portions 1003, 1007a, 1011a, 1015a of the source/drain layer here, the present disclosure is not limited thereto. For example, at least some of the portions 1003, 1007a, 1011a, and 1015a of the source/drain layer may be completely converted into silicide.

After that, as shown in FIG. 28, the gap under the hard mask layer 1019 may be filled by the dielectric layer 1043', and the processing may be continued as described above. The dielectric layer 1043' may have the same material as the shielding layer 1043.

FIGS. 29(a) to 30(c) show schematic views of some stages in the process of manufacturing the semiconductor device according to the embodiments of the present disclosure.

In the above embodiments, the contact portion in contact with the gate stack directly lands on the gate conductor layer in the gate stack. According to the embodiments of the present disclosure, a part of the gate stack, such as the part under the contact defining portion may be replaced with other conductive materials such as metal, so as to improve conductivity or the etching is better controlled to be stopped at the layer when patterning the gate stack (with reference to FIGS. 21 to 23).

For that, a part of the gate stack that is expected to remain (for example, the part under the device defining portion) may be shielded, and a part of the gate stack that is expected to be replaced (for example, the part under the contact defining portion) may be exposed. Similar operations have been described many times in the above embodiments.

Figure 29A:
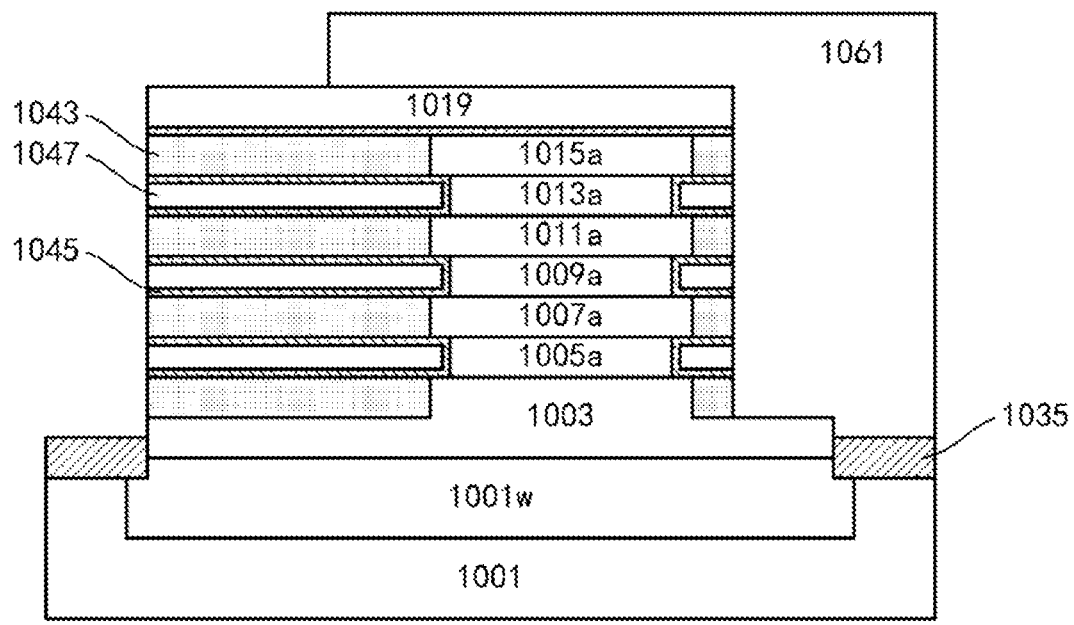
Figure 29B:
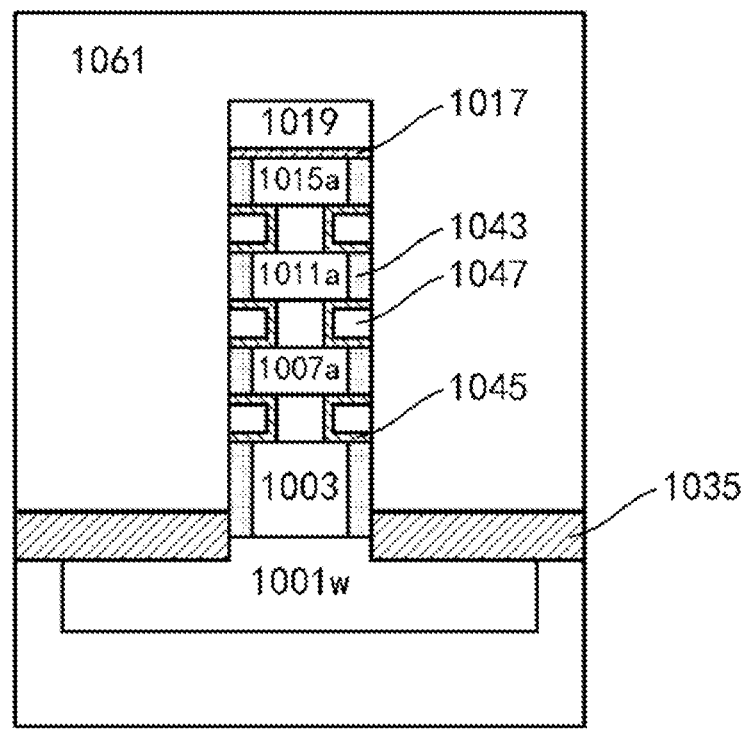
FIGS. 29(b) and 30(b) are sectional views along line BB' in FIG. 3(a)
Figure 29C:
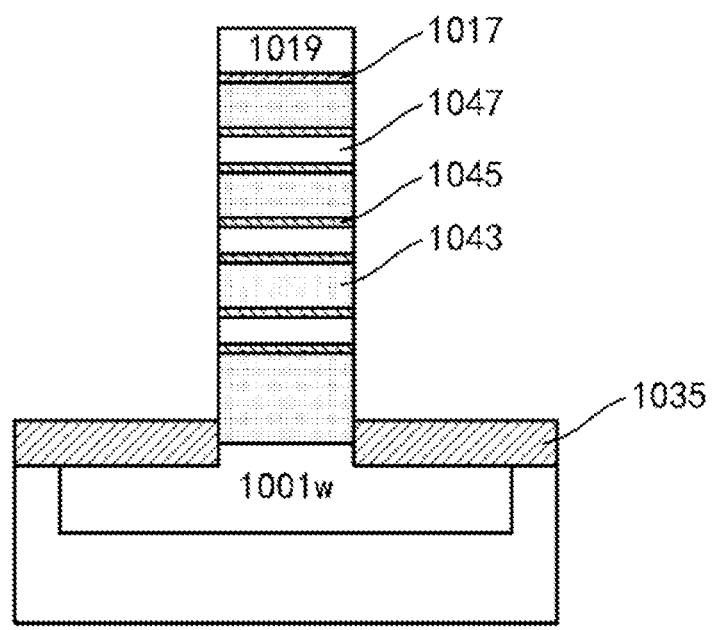
Figure 30A:
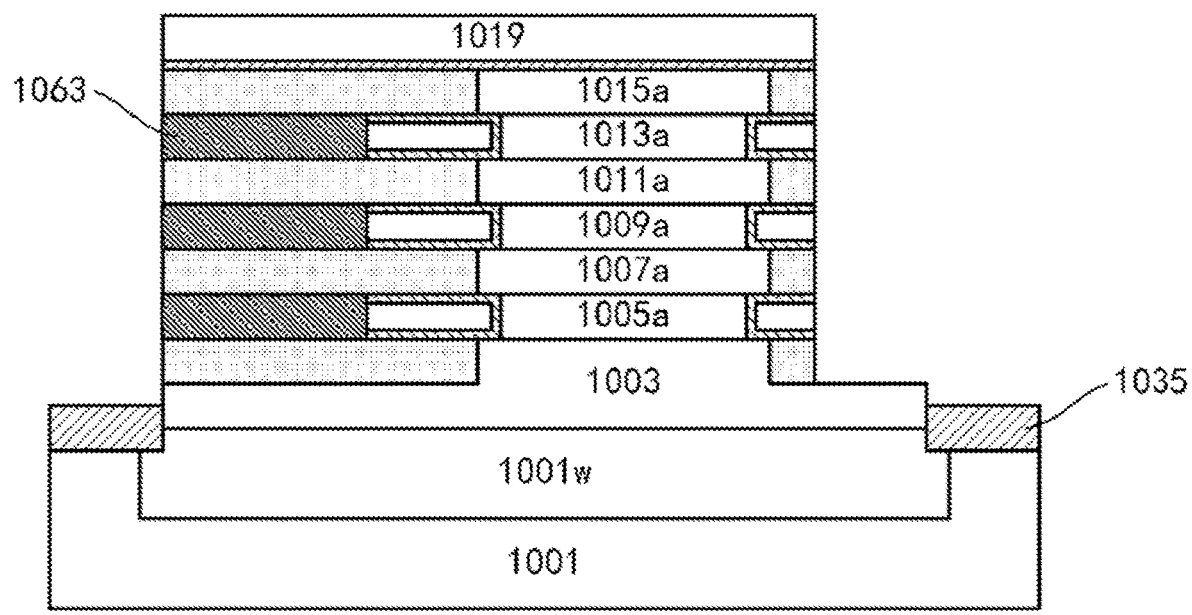
Figure 30B:
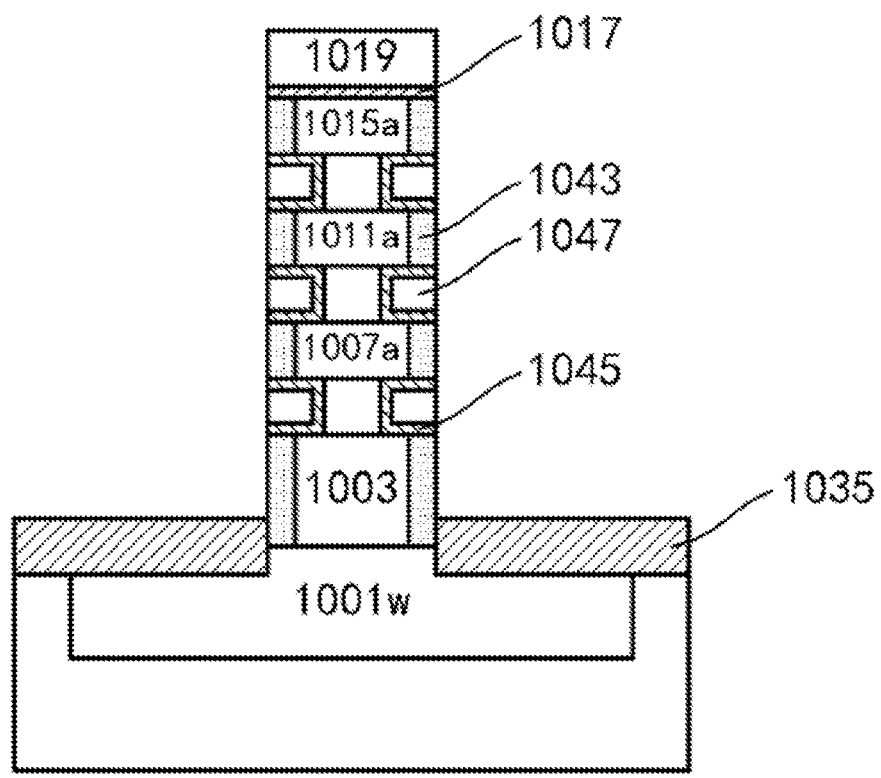
Figure 30C:
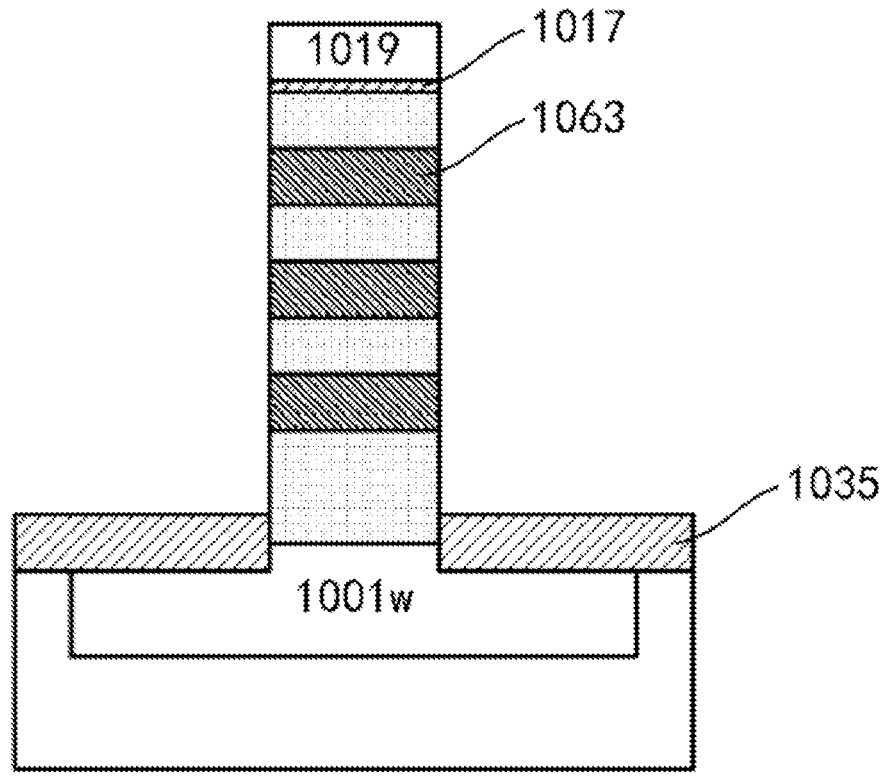

For example, as shown in FIGS. 29(a), 29(b), and 29(c), a photoresist 1061 may be formed to shield the part of the gate stack that is expected to remain (for example, the part under the device defining portion) and expose the part of the gate stack that is expected to be replaced (for example, the part under the contact defining portion). Then, as shown in FIGS. 30(a), 30(b), and 30(c), in the presence of the hard mask layer 1019 and the photoresist 1061, the gate stack may be selectively etched such as wet etching. In the space left due to the removal of the gate stack, a conductive material 1063 such as tungsten (W) or cobalt (Co) may be filled by, for example, deposition such as chemical vapor deposition (CVD) or atomic layer deposition (ALD). Since the gate dielectric layer is also removed, a thickness of the obtained conductive material 1063 may be greater than a thickness of the original gate conductor layer, and a resistance may be reduced.

Figure 31:
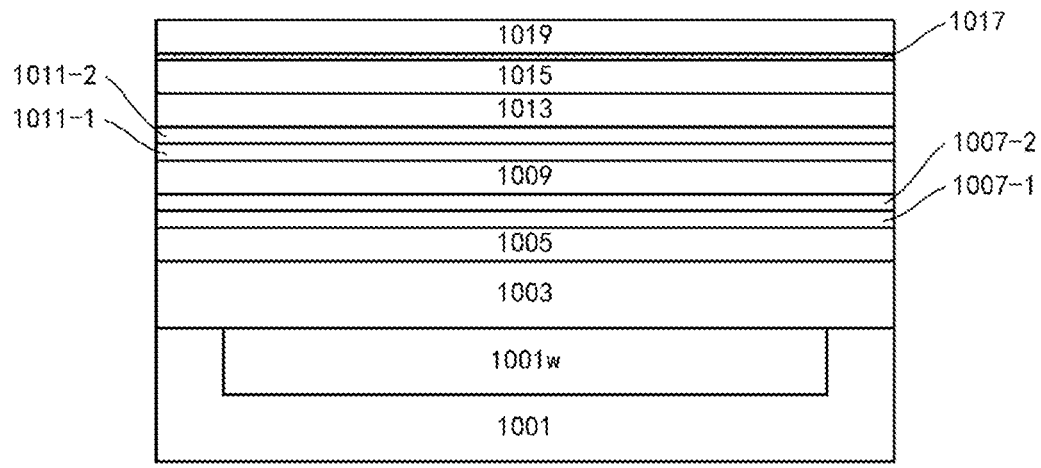
FIGS. 31 to 32 show schematic views of some stages in a process of manufacturing a semiconductor device according to the embodiments of the present disclosure.
Figure 32:
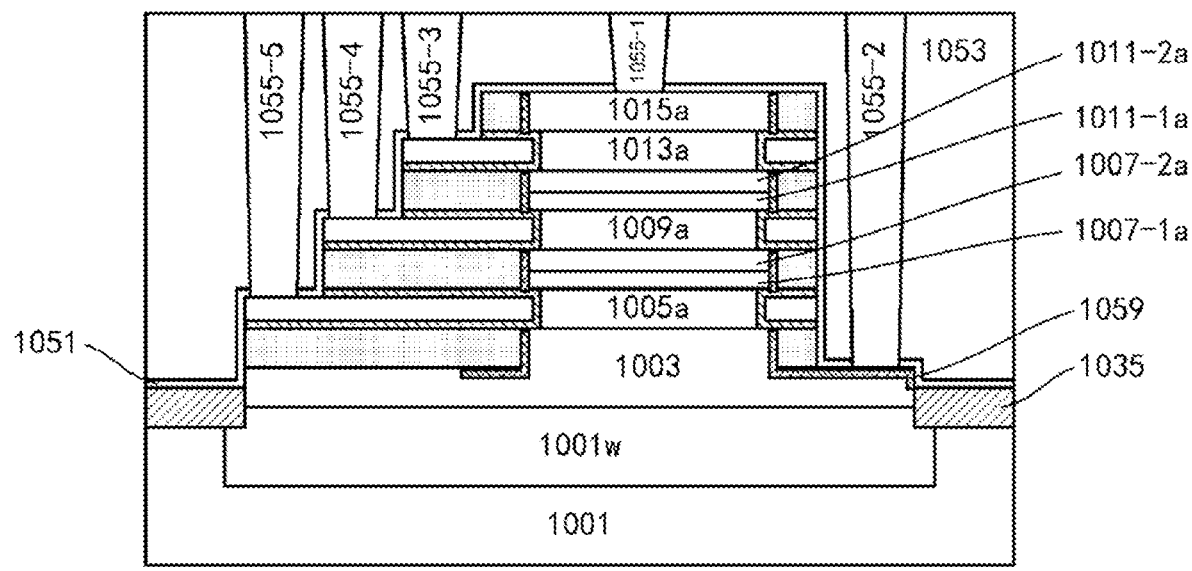

FIGS. 31 to 32 show schematic views of some stages in the process of manufacturing the semiconductor device according to the embodiments of the present disclosure.

The unit device according to the embodiments may be formed as a tunneling FET. In the case of tunneling FET, the source/drain layers on both sides of a same channel layer may be doped into different conductivity types.

As shown in FIG. 31, a well region 1001w may be formed in the substrate 1001. The well region 1001w may be doped into a conductivity type opposite to that of the source/drain layer connected thereto. After that, a stack of the source/drain layers 1003, (1007-1, 1007-2), (1011-1, 1011-2) and the channel layers 1005, 1009, 1013 stacked alternately may be formed in sequence by, for example, epitaxial growth. Here, two source/drain layers include sub-layers. Specifically, the source/drain layer between the channel layers 1005 and 1009 includes sub-layers 1007-1 and 1007-2, and the source/drain layer between the channel layers 1009 and 1013 includes sub-layers 1011-1 and 1011-2, so as to facilitate doping the two source/drain layers into different conductivity types. Of course, the present disclosure is not limited to this. For example, an upper part of a single source/drain layer and a lower part of the single source/drain layer may be doped into different conductivity types, instead of forming different sub-layers.

For example, the source/drain layer or sub-layer may include a semiconductor material such as Si with a thickness of about 5 to 50 nm, and the lowermost source/drain layer 1003 may have a slightly thicker thickness of about 20 to 100 nm. The channel layer may include a semiconductor material different from that of the source/drain layer or sub-layer, such as SiGe (an atomic percentage of Ge may be about 10 to 40%), and a thickness of the channel layer is about 10 to 100 nm. The sub-layers 1007-1 and 1007-2 between adjacent channel layers may be doped into different conductivity types, and the sub-layers 1011-1 and 1011-2 between adjacent channel layers may be doped into different conductivity types, thereby forming respective pn junctions. Resistances of the pn junctions are usually low even when reverse biased due to both sides are highly doped.

After that, it may be processed according to the above-described process to obtain a device as shown in FIG. 32. The device shown in FIG. 32 is substantially the same as the device shown in FIG. 25, except that the source/drain layers are divided into sub-layers and the silicide is formed on the surfaces of the source/drain layers. Through the silicide, the pn junction formed by the sub-layers of the source/drain layers may be short-circuited. According to other embodiments of the present disclosure, instead of forming silicide on the surface of the source/drain layer or in addition to forming silicide on the surface of the source/drain layer, other conductive materials such as metal may be formed. For example, in the processing described above in conjunction with FIGS. 18(a), 18(b), and 18(c), before the isolation portion 1043 is formed, a conductive material such as metal W may be filled in the gap left due to the removal of the source/drain layer (for example, by depositing and then performing RIE in the vertical direction), and the filled conductive material is etched back so that the conductive material occupies a part of the gap, and then the isolation portion 1043 is filled in the remaining part of the gap. With this conductive material, the pn junction may also be short-circuited.

The semiconductor device according to the embodiments of the present disclosure may be applied to various electronic apparatuses. For example, by integrating a plurality of such semiconductor devices and other devices (for example, other forms of transistors, etc.), it is possible to form an integrated circuit (IC) and thereby constructing an electronic apparatus. Therefore, the present disclosure further provides an electronic apparatus including the above-mentioned semiconductor device. The electronic apparatus may also include components such as a display screen matched with the integrated circuit and a wireless transceiver matched with the integrated circuit. Such electronic apparatus includes a smart phone, a computer, a tablet computer (PC), a wearable smart apparatus, a mobile power supply, and so on.

According to the embodiments of the present disclosure, a method of manufacturing a system on chip (SoC) is further provided. The method may include the above-mentioned method of manufacturing a semiconductor device. Specifically, a variety of devices may be integrated on a chip, at least some of which are manufactured according to the method of the present disclosure.

In the above description, the technical details such as patterning and etching of each layer have not been described in detail. However, those skilled in the art should understand that various technical means can be used to form layers, regions, etc. of desired shapes. In addition, in order to form the same structure, those skilled in the art may also design a method that is not completely the same as the method described above. In addition, although the embodiments are described above individually, this does not mean that the measures in the embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A method of manufacturing a vertical semiconductor device, comprising:
   providing a stack of source/drain layers and channel layers stacked alternately on a substrate;
   providing a hard mask layer on the stack, wherein the hard mask layer is patterned to have a device defining portion, a contact defining portion, and a connection portion located between the device defining portion and the contact defining portion, and in a top view, the connection portion is recessed relative to the device defining portion and the contact defining portion;
   patterning the stack by using the hard mask layer as a mask;
   etching the channel layers selectively to [form first horizontal recesses in] the channel layers under the device defining portion of the hard mask layer;
   filling [the first horizontal recesses] with a first dielectric layer;
   etching the source/drain layers selectively to [form second horizontal recesses in] the source/drain layers under the device defining portion of the hard mask layer;
   filling [the second horizontal recesses] with a second dielectric layer;
   performing a replacement gate process to replace the first dielectric layer with gate stacks, and wherein each of the gate stacks comprises a main body under the device defining portion of the hard mask layer, an end portion under the contact defining portion of the hard mask layer, and a connection portion under the connection portion of the hard mask layer; patterning at least a part of the end portion of each of the gate stacks so that an end portion of an upper gate stack exposes an end portion of a lower gate stack; and forming a contact portion on the end portion of each of the gate stacks, wherein the contact portion is in contact with the end portion.

2. The method according to claim 1, wherein patterning the hard mask layer comprises:
   forming a sacrificial layer on the hard mask layer; forming a first spacer on a sidewall of the sacrificial layer, and removing the sacrificial layer;
   forming a second spacer and a third spacer on opposite sides of the first spacer, respectively;
   patterning the second spacer into a first part and a second part separated from each other, and patterning the third spacer into a first part and a second part separated from each other, wherein the first part of the second spacer is opposite to the first part of the third spacer, and the second part of the second spacer is opposite to the second part of the third spacer; and
   patterning the first spacer to extend from between the first part of the second spacer and the first part of the third spacer to between the second part of the second spacer and the second part of the third spacer.

3. The method according to claim 1, wherein the method further comprises:
when patterning the stack, stopping the patterning in a lowermost source/drain layer of the stack; shielding a part of the lowermost source/drain layer; and
patterning the lowermost source/drain layer by continuing to use the hard mask layer as a mask.

4. The method according to claim 3, wherein the shielded part of the lowermost source/drain layer is on an opposite side of the contact defining portion of the hard mask layer relative to the device defining portion of the hard mask layer.

5. The method according to claim 1, wherein the etching the channel layers selectively comprises:
etching the channel layers selectively so that peripheries of the channel layers are recessed inward relative to a periphery of the hard mask layer,
wherein parts of the channel layers corresponding to the connection portion of the hard mask layer are etched away, so that each of the channel layers is divided into a first part corresponding to the device defining portion of the hard mask layer and a second part corresponding to the contact defining portion of the hard mask layer;
removing the second part of each of the channel layers while shielding the first part of each of the channel layers.

6. The method according to claim 1,
wherein the etching the source/drain layers selectively comprises:
etching the source/drain layers selectively so that peripheries of the source/drain layers are recessed inward relative to a periphery of the hard mask layer,
wherein parts of the source/drain layers corresponding to the connection portion of the hard mask layer are etched away, so that each of the source/drain layers is divided into a first part corresponding to the device defining portion of the hard mask layer and a second part corresponding to the contact defining portion of the hard mask layer;
removing the second part of each of the source/drain layers while shielding the first part of each of the source/drain layers.

7. The method according to claim 6, further comprising:
siliconizing each of the source/drain layers while shielding the second part of each of the source/drain layers.

8. The method according to claim 1, further comprising:
replacing a part of each of the gate stacks with a conductive material different from that of the other part of each of the gate stacks.

9. The method according to claim 1, wherein the source/drain layers are doped into a same conductivity type; or
the source/drain layers located on two sides of a same channel layer are doped into different conductivity types.

* * * * *